United States Patent [19]

Koenck

[11] Patent Number: 5,278,487
[45] Date of Patent: * Jan. 11, 1994

[54] BATTERY CONDITIONING SYSTEM HAVING COMMUNICATION WITH BATTERY PARAMETER MEMORY MEANS IN CONJUNCTION WITH BATTERY CONDITIONING

[75] Inventor: Steven E. Koenck, Cedar Rapids, Iowa

[73] Assignee: Norand Corporation, Cedar Rapids, Iowa

[ * ] Notice: The portion of the term of this patent subsequent to Oct. 2, 2007 has been disclaimed.

[21] Appl. No.: 769,337

[22] Filed: Oct. 1, 1991

Related U.S. Application Data

[60] Continuation of Ser. No. 544,230, Jun. 26, 1990, abandoned, which is a division of Ser. No. 422,226, Oct. 16, 1989, Pat. No. 4,961,043, which is a division of Ser. No. 168,352, Mar. 15, 1988, Pat. No. 4,885,523.

[51] Int. Cl.⁵ .................................................. H02J 7/00
[52] U.S. Cl. ........................................ 320/21; 320/36; 320/40; 320/43
[58] Field of Search ................ 320/21, 35, 36, 39, 320/40, 43, 44

[56] References Cited

U.S. PATENT DOCUMENTS

| | | | |
|---|---|---|---|
| 4,151,454 | 4/1979 | Iida | 320/43 |
| 4,455,523 | 6/1984 | Koenck | 320/43 |
| 4,553,081 | 11/1985 | Koenck | 320/43 |
| 4,709,202 | 11/1987 | Koenck et al. | 320/43 |
| 4,885,523 | 12/1989 | Koenck | 320/21 |

Primary Examiner—Emanuel T. Voeltz
Attorney, Agent, or Firm—McAndrews, Held & Malloy, Ltd.

[57] ABSTRACT

In an exemplary embodiment, a battery conditioning system monitors battery conditioning and includes a memory for storing data based thereon; for example, data may be stored representative of available battery capacity as measured during a deep discharge cycle. With a microprocessor monitoring battery operation of a portable unit, a measure of remaining battery capacity can be calculated and displayed. Where the microprocessor and battery conditioning system memory are permanently secured to the battery so as to receive operating power therefrom during storage and handling, the performance of a given battery in actual use can be accurately judged since the battery system can itself maintain a count of accumulated hours of use and other relevant parameters. In the case of a non-portable conditioning system, two-way communication may be established with a memory associated with the portable unit so that the portable unit can transmit to the conditioning system information concerning battery parameters (e.g. rated battery capacity) and/or battery usage (e.g. numbers of shallow discharge and recharge cycles), and after a conditioning operation, the conditioning system can transmit to the portable unit a measured value of battery capacity, for example.

20 Claims, 19 Drawing Sheets

U.S. Patent     Jan. 11, 1994     Sheet 1 of 19     5,278,487
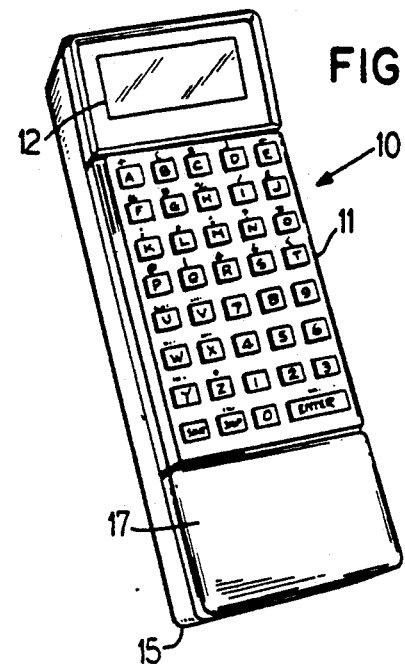
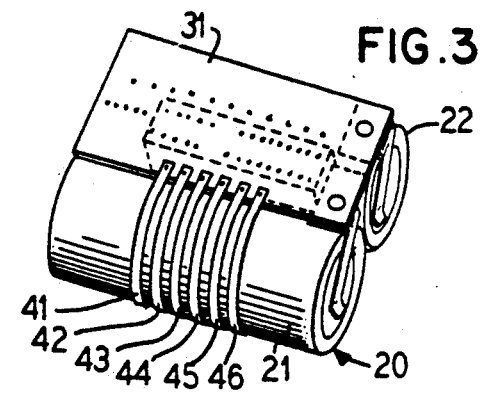
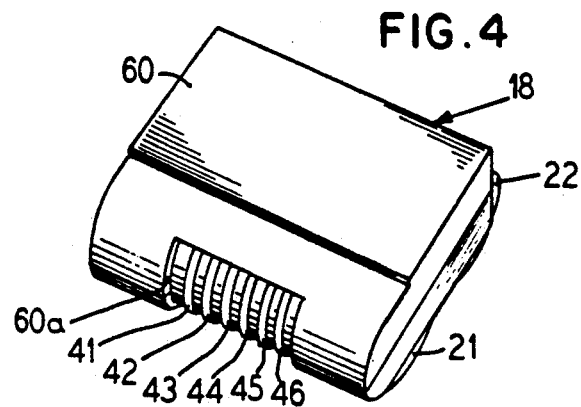
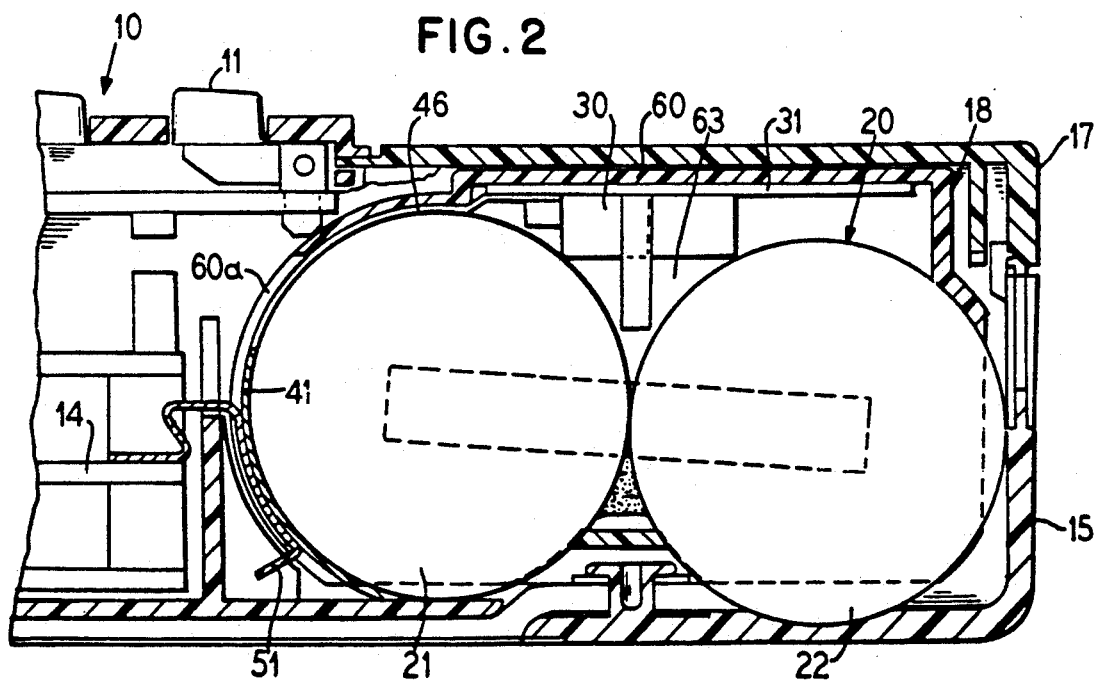

BATTERY CONDITIONING SYSTEM HAVING COMMUNICATION WITH BATTERY PARAMETER MEMORY MEANS IN CONJUNCTION WITH BATTERY CONDITIONING

CROSS-REFERENCE TO RELATED APPLICATIONS

This application is a continuation of application Ser. No. 07/544,230, now abandoned filed Jun. 26, 1991 which is a division of my copending application Ser. No. 07/422,226, filed Oct. 16, 1989, which is a division of my copending application Ser. No. 07/168,352, filed Mar. 15, 1988 entitled: "BATTERY CONDITIONING SYSTEM HAVING COMMUNICATION WITH BATTERY PARAMETER MEMORY MEANS IN CONJUNCTION WITH BATTERY CONDITIONING".

Reference also is made pursuant to 35 U.S.C. §120 to pending application U.S. Ser. No. 944,503 filed Dec. 18, 1986. Said pending application refers under 35 U.S.C. §120 to earlier applications U.S. Ser. No. 876,194 filed Jun. 19, 1986 (now U.S. Pat. No. 4,709,202 issued Nov. 24, 1987), and U.S. Ser. No. 797,235 filed Nov. 12, 1985 (now U.S. Pat. No. 4,716,354 issued Dec. 29, 1987. Said applications Ser. No. 797,235 and Ser. No. 876,194 refer, pursuant to 35 U.S.C. §120 to earlier application Ser. No. 612,588 filed May 21, 1984 (now U.S. Pat. No. 4,553,081 issued Nov. 12, 1985), which is a continuation-in-part of earlier application Ser. No. 385,830 filed Jun. 7, 1982 (now U.S. Pat. No. 4,455,523 issued Jun. 19, 1984), and all four of these earlier applications are also referred to herein in accordance with the provisions of 35 U.S.C. §120.

INCORPORATION BY REFERENCE

The disclosures and drawings of the above-mentioned U.S. Pat. Nos. 4,455,523 and 4,553,081, and of the pending application U.S. Ser. No. 944,503 are hereby incorporated herein by reference in their entirety.

BACKGROUND OF THE INVENTION

The present invention relates to a battery conditioning system for battery means of portable computerized devices, and particularly to a hand-held device including data storage means for storing data pertinent to the battery means of the device, and to a battery conditioning control system including an external charging circuit equipped for communication with data storage means of the hand-held device and/or of the battery means operatively associated with such device. Preferably the control system is capable of optimizing the performance of a rechargeable electrochemical storage medium while at the same time maximizing its useful life. The invention also relates to control systems generally, and to control systems forming part of hand-held units.

Portable computerized systems are presently being extensively utilized in a wide range of applications. For example, such systems may be utilized in delivery vehicles which are to be away from a central warehouse or the like for a major part of each working day. Recharging operations may take place in locations subject to extremes of temperature. It is particularly crucial to avoid an equipment failure where a portable device is a vital link to the completion of scheduled tasks at remote locations and the like. In such circumstances, a loss of adequate battery power can be just as detrimental as any other malfunction.

Particularly where the battery conditioning control system is to be incorporated in hand-held devices, such control system should be lightweight and compact, and should consume minimum power. For the sake of economy, a microprocessor of a standard design and of minimum complexity, is highly desirable.

It is conceived that a particularly advantageous battery conditioning system is achieved where significant portions of the conditioning circuitry are external to the battery operated portable device, and where the portable device contains data storage means which is capable of reliably and flexibly providing information e.g. to the external circuitry for optimizing battery conditioning operations.

SUMMARY OF THE INVENTION

It is a basic objective of the present invention to achieve a conditioning system for hand-held battery powered devices providing increased reliability and useful life, and particularly to provide a charging system for hand-held devices wherein charging operation can be based on the use history and/or other relevant information concerning the specific battery means.

A further object of the present invention is to provide a control system particularly adapted to control battery conditioning of a variety of rechargeable battery means, automatically adaptable to hand-held devices having battery means of different types such as to require different conditioning parameters.

Another object of the invention is to provide a charging current control system for battery powered portable devices which is not only lightweight and compact but which consumes minimum power, and which preferably is adapted to be implemented as an integrated circuit of an economical and simple construction.

An exemplary feature of the invention resides in the provision of a battery conditioning system receptive of different hand-held devices and capable of communication therewith, e.g., to determine the type of conditioning required for respective different internal battery means thereof.

A further feature of the invention relates to a battery conditioning system wherein the system can obtain a relatively accurate indication of the battery energy remaining available for use for one type or a plurality of different types of batteries, and supply the results to a memory means accompanying the battery means during portable operation.

For the sake of recharging of a battery system as rapidly as possible without detriment to an optimum useful life span, battery parameters including battery temperature can be monitored and transmitted to a conditioning system during a charging cycle, and the battery charging current can be adjusted accordingly.

Since a battery may deteriorate when subjected to repeated shallow discharge and recharging cycles, according to the present invention, a count of such shallow charge cycles may be automatically maintained throughout the operating life of the battery system, such that deep discharge cycles may be effected as necessary to maintain desired performance standards.

Furthermore, according to another highly significant feature of the invention, automatically operating battery monitoring and/or conditioning circuitry may be secured with the battery pack for handling as a unit therewith. The monitoring circuitry may receive its operating power from the battery pack during storage of handling such that a total history of the battery pack may be retained for example in a volatile memory circuit where such type of memory otherwise provides optimum characteristics for a portable system. The conditioning circuitry may have means for effecting a deep discharge cycle, and concomitantly with the deep discharge cycle, a measure of actual battery capacity may be obtained. From such measured battery capacity and a continuous measurement of battery current during portable operation, a relatively accurate "fuel gauge" function becomes feasible such that the risk of battery failure during field operation can be essentially eliminated. The performance of a given type of battery in actual use can be accurately judged since the battery system can itself maintain a count of accumulated hours of use, and other relevant parameters.

In a simplified system in successful use, the conditioning system is incorporated in the portable utilization device such that the programmed processor of the utilization device may itself automatically effect a deep discharge conditioning cycle and/or a deep discharge capacity test. The deep discharge cycle may be effected at a controlled rate, such that the time for discharge from a fully charged condition to a selected discharge condition may itself represent a measure of battery capacity. Instead of directly measuring battery current during use, the programmed processor may maintain a measure of operating time and/or elapsed time during portable operation, so as to provide an indication of remaining battery capacity. A time measure of operating time may be utilized to automatically determine the time duration of the next charging cycle. When both a main battery and a back-up battery are present, the operating time of each may be individually accumulated, and used to control the time duration of the respective recharging operations.

Additional features of a commercial system in successful use include individual charging and discharging circuits for a main battery and a back-up battery for reliable conditioning of the back-up battery independently of the state of the main battery. Desired parameters such as main battery voltage, ambient temperature (e.g. in the main battery case or in the battery compartment), and charging voltage may be obtained by means of an integrated circuit analog to digital converter, which thus replaces several comparators and many precision costly components of a prior implementation.

While in an early embodiment, battery charging current was set using a digital to analog converter to establish a set point for an analog current control loop, it is a feature of a further embodiment herein to provide a digital computer for both computing a desired current set point and for modulating current pulses in the battery charging circuit for maintaining a desired average current. Preferably, a computer circuit with a moderate clock rate may determine current pulse modulation steps and control sampling of actual current pulses for purposes of generating a feedback signal. An aliasing type of sampling systematically taken at different phases of the actual current pulse waveform enables use of a particularly low sampling rate.

In a further significant development of the invention, important portions of the conditioning circuitry are external to the battery operated portable device, and yet information specific to a given battery means is retained with the portable device. In an exemplary implementation, a computer operating means of the portable device is programmed and provided with battery information sufficient to select an optimum battery charging rate, for example, e.g., a fast charge or a maintenance charge, and preferably to adjust the charge rate e.g. based on a measure of battery temperature. In a presently preferred system, an external standardized charging circuit has a default condition wherein a charging current is supplied suitable to older types of terminals. Such a charging circuit, however, can be controlled by the computer operating means of preferred types of portable devices so as to override the default charging rate. In this way charging rate may be a function not only of a respective rated battery capacity, but also of other parameters such as battery terminal voltage prior to coupling of the portable device with the charging circuit and/or extent of use of the portable device after a previous charge. In certain applications with high peaks of battery drain, e.g. R. F. terminals, it is advantageous to avoid a resistance in series with the battery for measuring battery drain during use; an alternate approach measuring operating time in various modes can then be particularly attractive. An advantageous data communication coupling between a portable device computer operating means and a charging circuit is via a data storage register and digital to analog converter. The register can be operated from a battery means while the computer operating means may be in a sleep mode, for example, once the register has received a suitable computer generated command. The digital to analog converter need only be active during a battery charging cycle and can be decoupled from the battery means during portable operation. Such a digital to analog converter is particularly suitable for generating an analog control signal for overriding a default setting of a standardized charging circuit such as described hereinabove.

In a new RF terminal unit, it is conceived that it may be advantageous to make the output of a battery temperature measuring transducer available at an external contact of the terminal so that a low cost charger could supply a charging current taking account of a relatively accurate measure of battery temperature. Further by making temperature transducer (nonzero) output dependent on the presence of charging potential at the terminal, the same temperature sensing line provides an indication as to whether charging potential is present.

The invention will now be described, by way of example and not by way of limitation, with references to the accompanying sheets of drawings; and other objects, features and advantages of the invention will be apparent from this detailed disclosure and from the appended claims.

BRIEF DESCRIPTION OF THE DRAWINGS

FIGS. 1 through 17 and the brief description thereof are incorporated herein by reference to U.S. Ser. No. 876,194, now U.S. Pat. No. 4,709,202 issued Nov. 24, 1987.

DETAILED DESCRIPTION

The detailed description of FIGS. 1 through 17 is incorporated herein by reference to the specification at col. 4, line 25, through col. 66, line 4, of the incorporated U.S. Pat. No. 4,709,202.

Description of FIGS. 18, 19, 20A, 20B, 21 and 22

Figure 18:
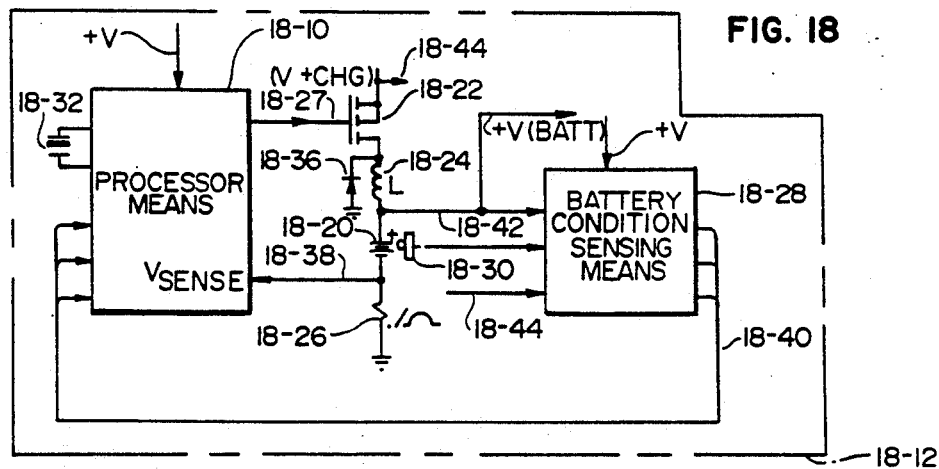
FIG. 18 is an electric circuit diagram for illustrating a preferred embodiment of battery charging current control system in accordance with the present invention.
Figure 20A:
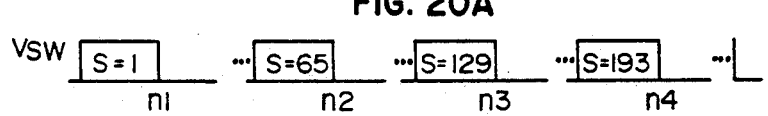
FIG. 20A shows selected control pulses which may be generated during control of battery charging current in the control system of FIG. 18.

FIG. 18 shows processor means such as an integrated circuit microprocessor 18-10 which may form part of a circuit package of a battery pack 18-12. The circuit package may be secured with a rechargeable battery means 18-20, an association of such parts being shown in detail in FIGS. 2, 3 and 4. During a battery charging operation, a battery charging means such as 12-24, FIG. 12, may provide a charging potential to a hand held computer unit such as 71, FIG. 5, and the unit 71 may supply an operating voltage +V to microprocessor 18-10 and may supply a charging potential +CHG to a series circuit including a current switch or current regulator means 18-22, an energy storage inductor means 18-24, battery means 18-20, and a current sense resistor 18-26. The processor means 18-10 may supply to line 18-27 rectangular pulses of a voltage waveform Vsw as shown in FIG. 20A. The duration or active duty cycle of the voltage pulses of waveform Vsw is modulated in discrete modulation steps to vary the turn-on time of switch means 18-22, and thus to vary battery charging current.

As in the embodiment of FIGS. 1 through 8, battery means 18-20 may have battery charging parameter sensing means associated therewith as indicated at 18-28. Such parameter sensing means may have a battery temperature sensing transducer 18-30 corresponding to transducer 134, FIG. 9-A, and transducer 18-30 may be physically disposed in heat transfer relation to battery pack 18-12 as indicated in FIG. 18.

In the embodiment of FIG. 18, processor means 18-10 may be controlled by a constant frequency means such as crystal 18-32. The clock rate of crystal 18-32 may be used to synchronize turn on of switch means 18-22 so that active duty cycles are initiated at a uniform time interval of less than one microsecond and may provide a desired number of modulation steps for the active duty cycle of the turn-on waveform Vsw. By way of example, the operating frequency of crystal 18-32 may be six megahertz (i.e. thirty-two times a duty cycle frequency of 187.5 kilohertz) and may provide a time interval between activations of switch means 18-22 of 5.3333 microseconds with each such time interval being subdivided into thirty-two modulation steps. A moderate operating frequency of crystal 18-32 is favorable for a control system with low energy consumption, and an economical processor means.

Figure 19:
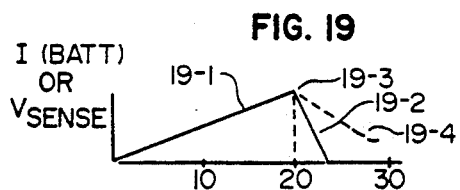
FIG. 19 shows an exemplary current pulse waveform which may correspond with a maximum battery charging rate in a substantially linear operating range for an exemplary control system in accordance with FIG. 18.

In the above example, the turn-on time of switch means 18-22 may have different possible time durations per cycle corresponding to respective different numbers of the thirty-two modulation steps. The modulation steps may represent increments of 166.7 nanoseconds in the time duration of the active duty cycle of the waveform Vsw at line 18-27. Essentially, maximum current flow in inductor 18-24 may correspond with a turn-on time corresponding to at least sixty percent of the maximum available on-time of switch means 18-22. For example, current flow may increase relatively linearly as represented in FIG. 19 by sloping line 19-1 for numbers of time increments between zero and twenty or more. The circuit of FIG. 18 includes means such as diode 18-36 for maintaining current flow when switch means 18-22 is turned off, the circuit preferably providing a current decay characteristic generally as indicated at 19-2 in FIG. 19. Generally the current may decay to zero in less than one-half of the turn-on time of switch means 18-22, for the case of active duty cycles which provide a linear characteristic such as 19-1. For example, if the peak value 19-3 in FIG. 19 corresponds to twenty time increments of 3.33 microseconds (20 times 166.7 nanoseconds equals 3.33 microseconds), then the decay interval may be less than ten increments, i.e. less than 1.67 microseconds.

FIG. 20A shows turn-on pulses Vsw of relatively constant duration, corresponding to numbers of turn-on increments, e.g. n1=16, n2=17, n3=17, n4=18.

Figure 20B:
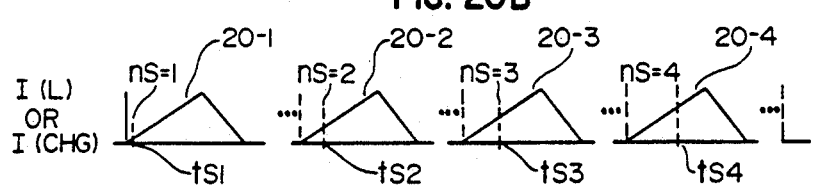
FIG. 20B shows respective corresponding battery charging current pulses on the same time scale with vertically aligned portions of the waveforms of FIGS. 20A and 20B occurring at the same time.

FIG. 20B shows the corresponding current flow in inductance 18-24, designated I(L) and the corresponding battery charging current I(CHG).

In each case, the rising current characteristics 20-1 to 20-4 are linear where the number of increments is less than the number corresponding to peak 19-3 in FIG. 19.

In FIG. 18, current sense resistance 18-26 is of a value much less than the resistance of battery means 18-20; for example, resistance means 18-26 may have a resistance value of 0.1 ohm. FIG. 20B thus also represents the waveform Vsense supplied at line 18-38 of FIG. 18, for the respective durations of Vsw of FIG. 20A. The processor means 18-10 includes analog to digital converter channels such as that associated with resistor 135, FIG. 9A, so that the battery temperature analog signal at 18-40 and the battery current analog signal at 18-38 may be converted into corresponding digital values.

While waveforms such as those represented in FIG. 20B would normally be sampled at a relatively high rate in comparison with the operating frequency of component 18-32, in a preferred embodiment the sampling rate of the pulsating analog waveform at line 18-38 is made lower than the rate of component 18-32 and preferably less than the active duty cycle frequency of waveform Vsw. Thus, the analog to digital converter means of processor 18-10 preferably deliverately under samples the current sense line 18-38 to alias the charging current waveform I(CHG) to a very low frequency.

For the example of a repetition rate Fsw for the active duty cycles of waveform Vsw of 187.5 kilohertz, sampling may take place roughly at a frame sampling rate of 1/64 Fsw or roughly 2,929 hertz. The actual aliasing sampling rate, however, is not precisely synchronized with the switch activation rate Fsw, but differs slightly therefrom, for example, by one time increment or duty cycle modulation step of waveform Vsw, e.g. by a time increment of 166.7 nanoseconds per frame interval. This example of sampling can be visualized if the successive pulses of Vsw as supplied to line 18-27, FIG. 18, are identified as S=1, S=2, S=3, etc., and if the pulses of FIG. 20B are then considered to correspond to Vsw pulse numbers S=1, S=65, S=129 and S=193, as indicated in FIG. 20A, and if the successive sampling points are identified as ns1, ns2, ns3, ns4, etc.

If there are thirty-two different possible sampling points for each Vsw pulse, then FIG. 20B illustrates successive sampling points ns=1, ns=2, ns=3 and ns=4. In this example, one complete scan of the pulse configuration of the Vsense waveform at line 18-38 would take place for each 2049 Vsw pulses.

Figure 21:
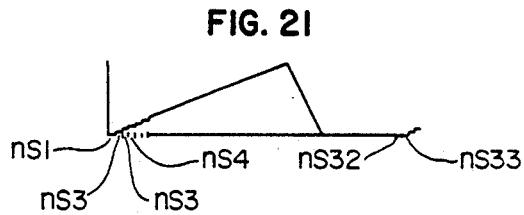
FIG. 21 is a diagrammatic view of use in explaining the aliased sampling of actual current pulses in the battery charging circuit, and illustrating the case where thirty-two samples form a complete sampling cycle.

The resultant sampled waveform for a complete sampling cycle is diagrammatically indicated in FIG. 21 for the example of sampling as represented in FIGS. 20A and 20B.

If the frame sampling rate for the Vsense waveform on line 18-38 is roughly 1/256 Fsw, or about 732.42 hertz, then with one time increment of 167 nanoseconds added for each sampling frame, an actual sampling frequency of about 732.33 hertz results corresponding to 1.3655 milliseconds per sample. If thirty-two sample points of the Vsense waveform are scanned per complete sampling cycle, then one complete sampling cycle corresponds to 0.043696 second, or a frequency of 22.88 hertz.

After each sample of the Vsense waveform, a corresponding average current value can be computed, by adding the most recent sample value (e.g. at ns33, FIG. 21) and subtracting the oldest sample value (e.g. sample ns1, FIG. 21), so that a new average current would be calculated at each 1.3655 milliseconds for the case of a sampling frequency of about 732.33 hertz. A sample and hold circuit may retain the sampled value of Vsense during the analog to digital conversion process.

The preferred embodiment with an aliased sampling rate is considered applicable to current measurements where changes in the current waveform pulses are relatively slow, e.g. slower than the rate of change shown in FIG. 20B, where the alternating polarity component of the Vsense voltage averages out over a complete sampling cycle, and where the need for dynamic regulation of the current I(L) is minimal, i.e. the average direct current level per complete sampling cycle is the critical value to be regulated.

The slow rate aliasing type of sampling is useful to adapt the sampling frequency to that feasible with an economical and simple processing means 18-10 (e.g. a type 8,048 microprocessor). Other aliasing sampling approaches could operate by scanning at a desired frame interval less one pulse, e.g. for the example of FIGS. 20A and 20B to sample Vsense at Vsw pulses corresponding to S=1, ns1=1; S=64, ns2=32; S=128, ns3=31; S=192, ns4=30; etc. Other schemes to scan the Vsense signal could both skip frames and slip sample points, e.g. sampling Vsense at Vsw pulses corresponding to S=1, ns1=1; S=128, ns2=32; S=256, ns3=31; S=384, ns4=30; etc., or S=1, ns1=1, S=129, ns2=2; S=257, ns2=3; S=385, ns4=4, etc.

By way of example, processor 18-10 may read battery temperature via input 18-40 at ten second intervals, and adjust the charging current set point value accordingly at each ten second reading of temperature. A noise filter in the form of a digital algorithm may insure that the actual digital current readings based on Vsense are free of disruptive noise.

By way of example, if the waveform of FIG. 19 corresponds to a duration of Vsw of twenty modulation increments and a charging rate of about C/8, then for temperatures of less than minus twenty degrees Celsius (−4° F.), the active duty cycles of Vsw may be set to zero; for temperatures between minus twenty degrees Celsius and minus ten degrees Celsius (+14° F.), the charging current may be set to about C/20 resulting in an average of about eight modulation increments for each active duty cycle of Vsw); for temperatures between minus ten degrees Celsius and zero degrees Celsius (32° F.), the charging current may be set to about C/16 (resulting in an average of about ten modulation increments for each active duty cycle of Vsw); for temperatures between zero degrees Celsius and ten degrees Celsius (50° F.), the charging current may be set to C/10 (to produce an average of about sixteen modulation increments for each active duty cycle of Fsw); for temperatures between ten degrees Celsius and seventy degrees Celsius (158° F.), the charging rate may be set to about C/8; above seventy degrees Celsius, the charging rate may be set to about C/100, (the active duty cycle of Fsw then varying generally between one modulation increment and two modulation increments in successive ten second intervals).

In a less precise control system, the programming of processor 18-10 may simply provide a table of numbers of modulation increments for the active duty cycle of Fsw according to respective ranges of measured temperature readings in digital form and the values of measured charging current may not enter into the selection of modulation increments. In such an open loop system, the sampling of charging current may be used for the fuel gauge function during normal operation of the hand held unit such as indicated at 10 in FIGS. 1 and 2, or in FIGS. 10, or at 12-10, FIG. 12. As described with reference to FIG. 12, the circuitry of FIG. 18 may be permanently associated with the hand held device 10, rather than being a permanent part of the battery pack. As another embodiment, the circuitry of FIG. 18 may be a permanent part of the battery pack along with a casing 60, FIG. 4, while the rechargeable battery means 18-20, FIG. 18, may be readily removable from casing 60 so as to be replaceable without replacement of components such as 18-10, 18-22, 18-24, 18-26, 18-28, 18-30, and 18-32. The transducer 18-30 need not be in physical proximity with the battery means 18-20. The processor 18-10 and switch means 18-22 can be part of the same silicon chip, for example. As indicated at 18-42, sensing means 18-28 may also receive an analog measure of battery voltage as indicated by a V(BATT) input at 18-42 and/or an analog measure of input charging voltage V(+CHG) as indicated at 18-44, and supply such analog measures to an analog to digital channel of processor means 18-10.

In generating the Vsw waveform, the processor 18-10 may load a number equal to the number of desired modulation increments for the active duty cycle of Vsw into a register, and apply a suitable turn on voltage to line 18-27 until a number of clock pulses of oscillator means 18-32 has been counted corresponding to the number selected.

Figure 22:
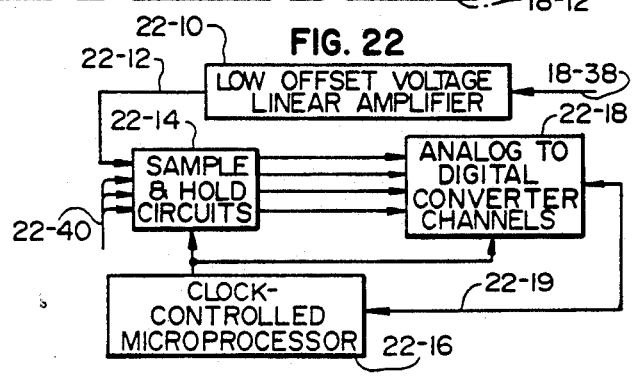
FIG. 22 is a block diagram for illustrating exemplary sampling circuitry for association with the V sense input of the processor means of FIG. 18.

As indicated in FIG. 22, the voltage across current measuring resistor 18-26, FIG. 18, may be supplied via line 18-38 to a low offset voltage linear amplifier 22-10. The output signal at 22-12 from amplifier 22-10 and the analog signals of multiconductor line 18-40 are supplied to respective sample and hold circuits of component 22-14. Successive samples of the battery current measurement waveform such as indicated at ns1, ns2, ns3, ns4, ..., ns32, ns33, ..., FIG. 21, may be selected by means of microprocessor 22-16 which is controlled by clock 18-32. Each sample may be obtained over a sample interval which may be equal to the clock period interval of one-sixth microsecond, for example, and may be held until it is converted to digital form by component 22-18 and supplied to a register of microprocessor 22-16 e.g. via conductors of a data bus forming part of the interconnecting means 22-19. The other analog signals are similarly sampled and transmitted e.g. to respective further registers of microprocessor 22-16.

The microprocessor 22-16 may be programmed to compute a new average battery charge rate with each sample of actual battery current after the first N samples. The microprocessor would also take account of any changes in battery temperature, for example. As a specific example, it may be desired to maintain a maximum battery charging rate consistent with assurance of prolonged battery life, e.g. avoiding an excessive overcharge rate as discussed in relation to FIG. 6.

Figure 6:
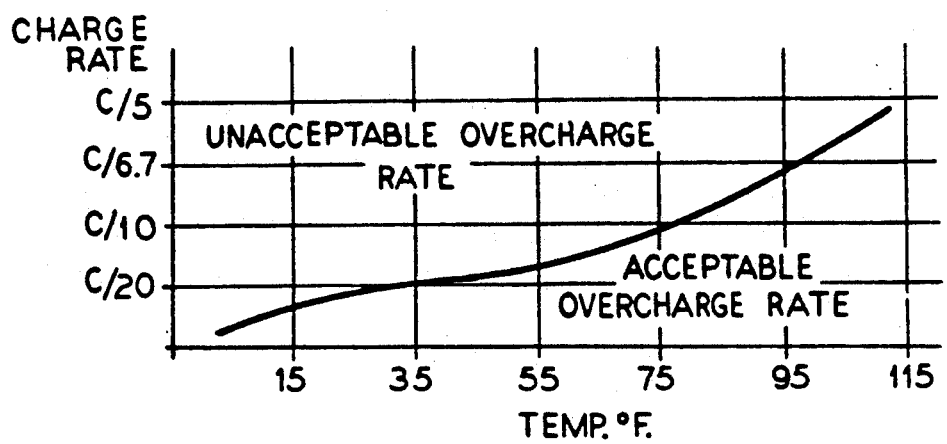
Figure 7:
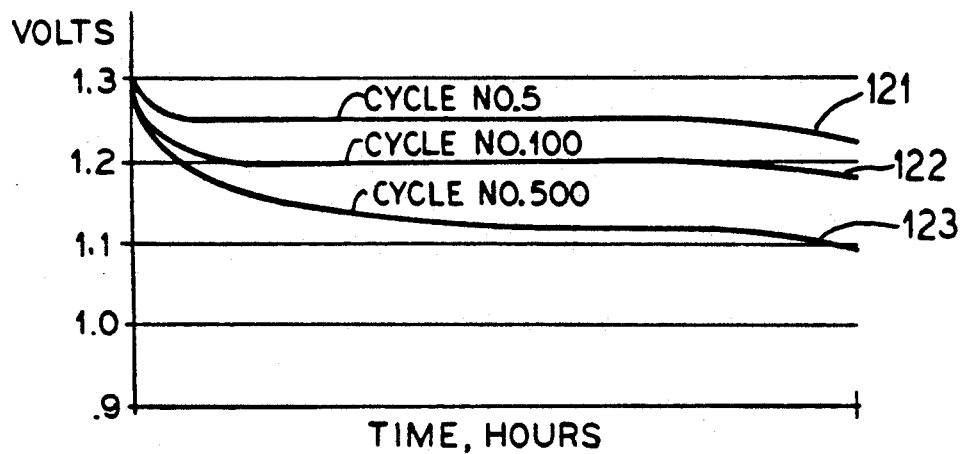
Figure 8:
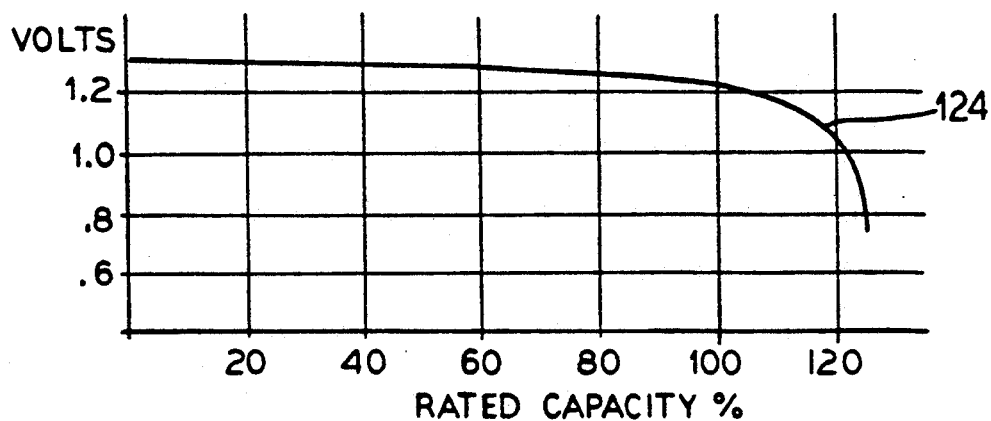
Figure 9A:
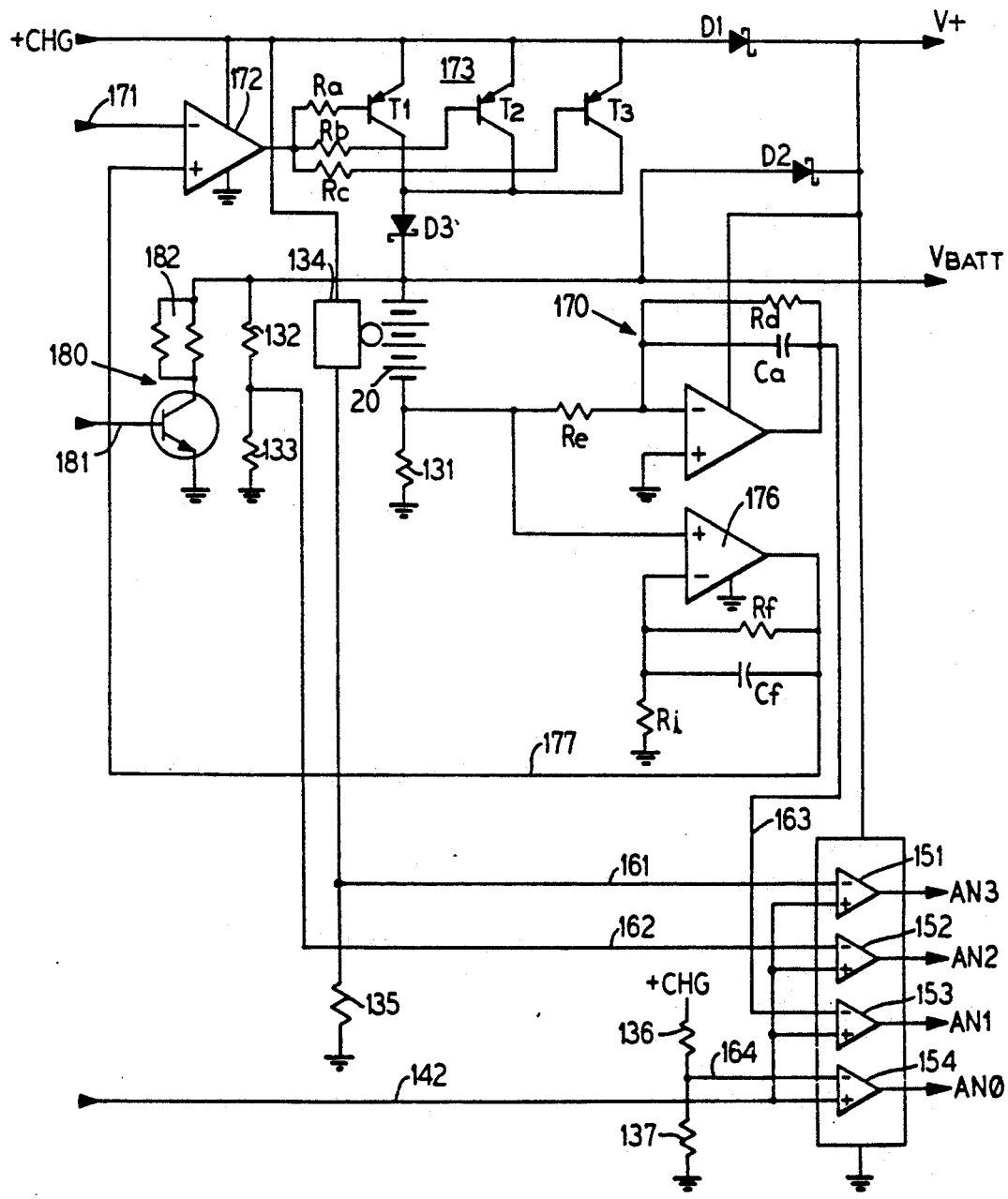
Figure 9B:
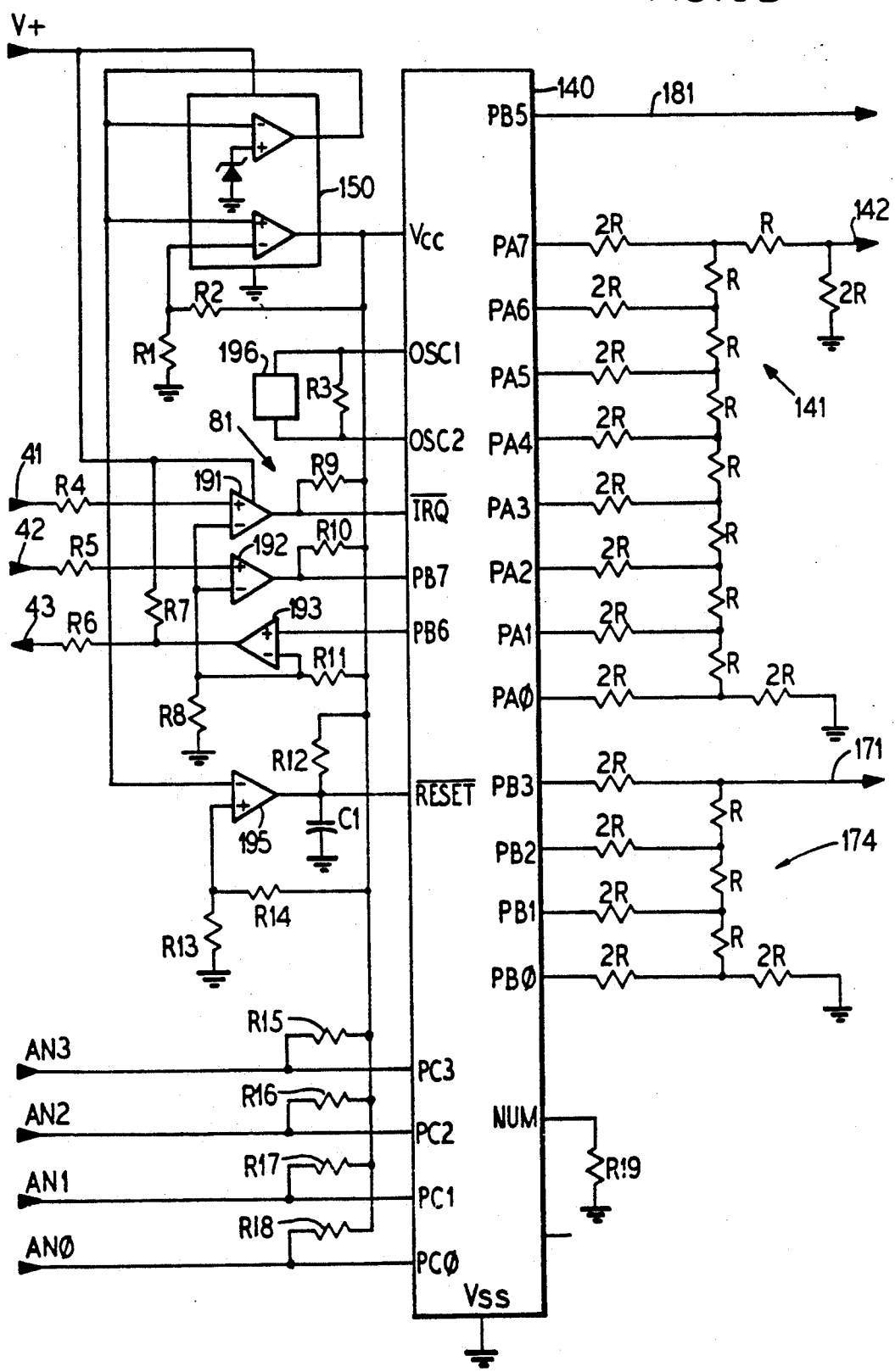
Figure 10:
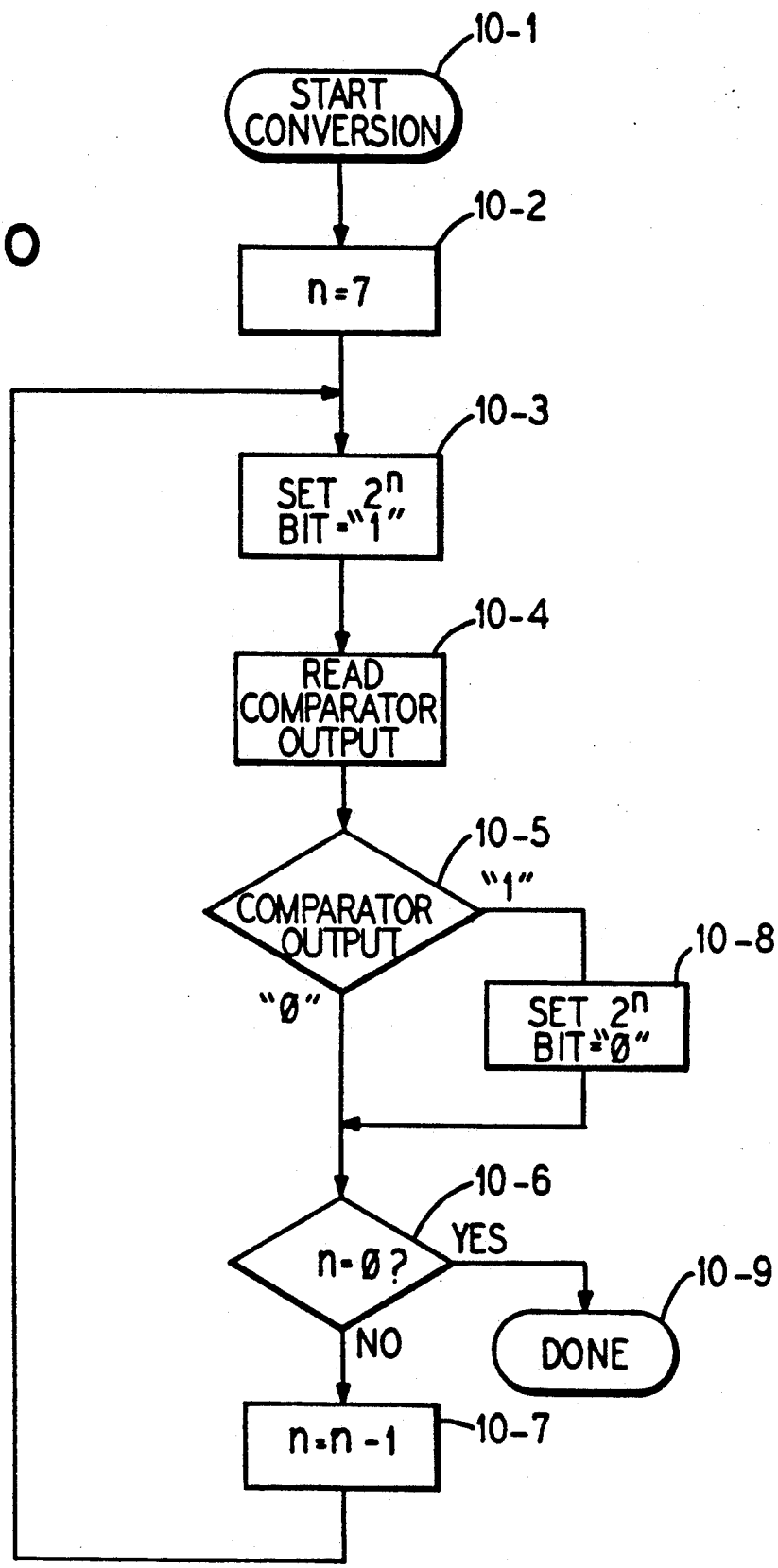
Figure 11:
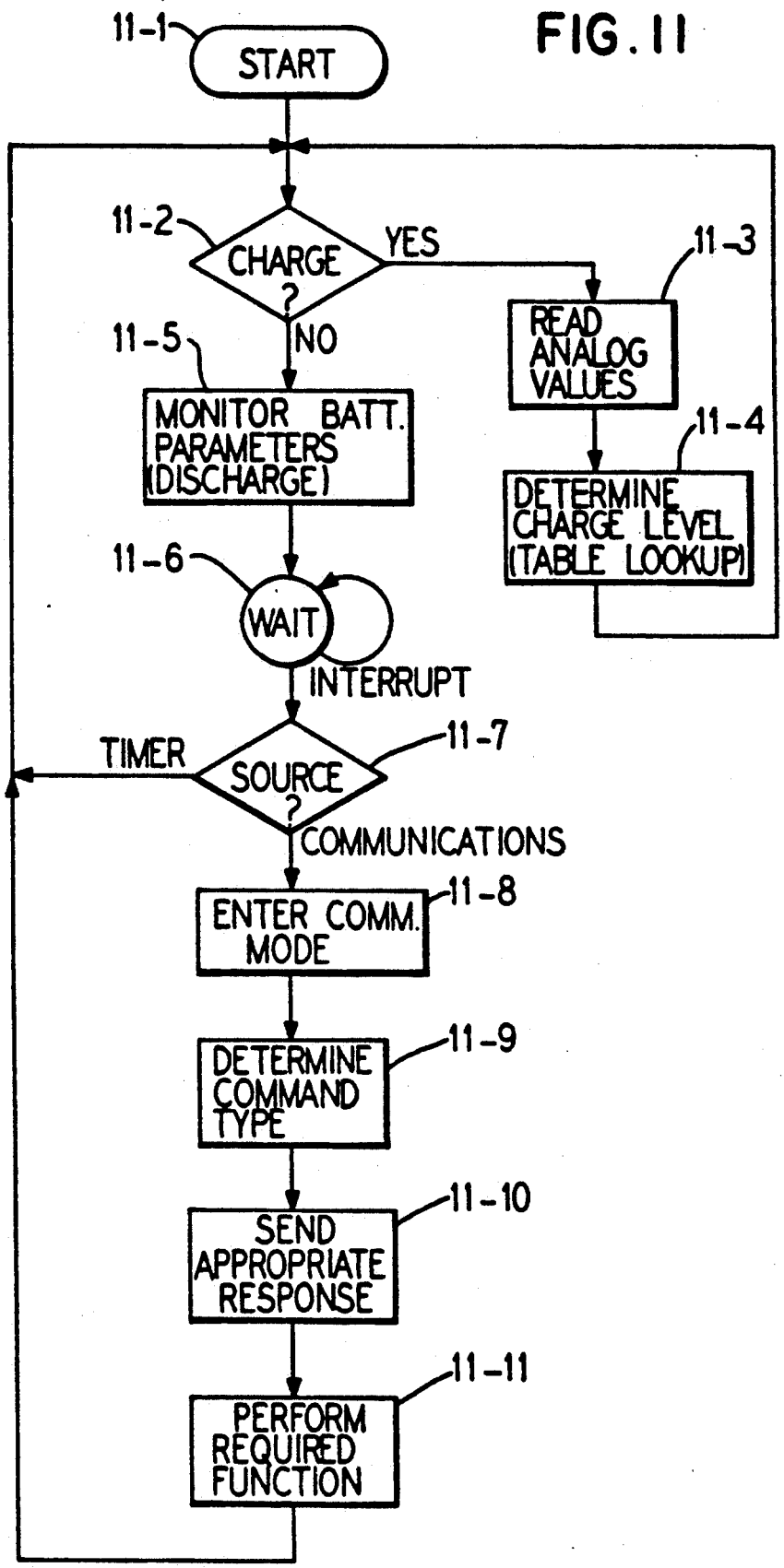
Figure 12:
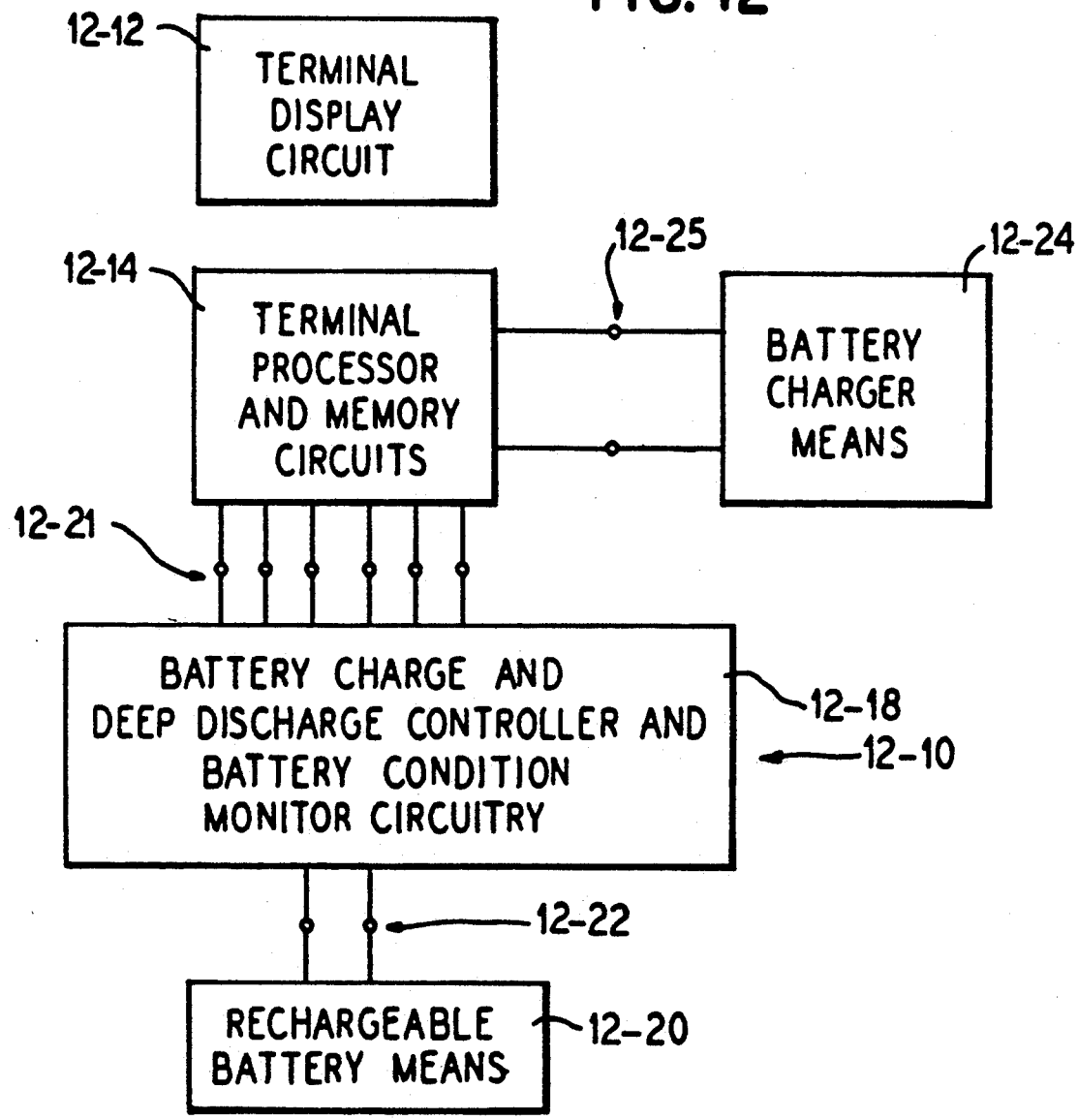
Figure 13:
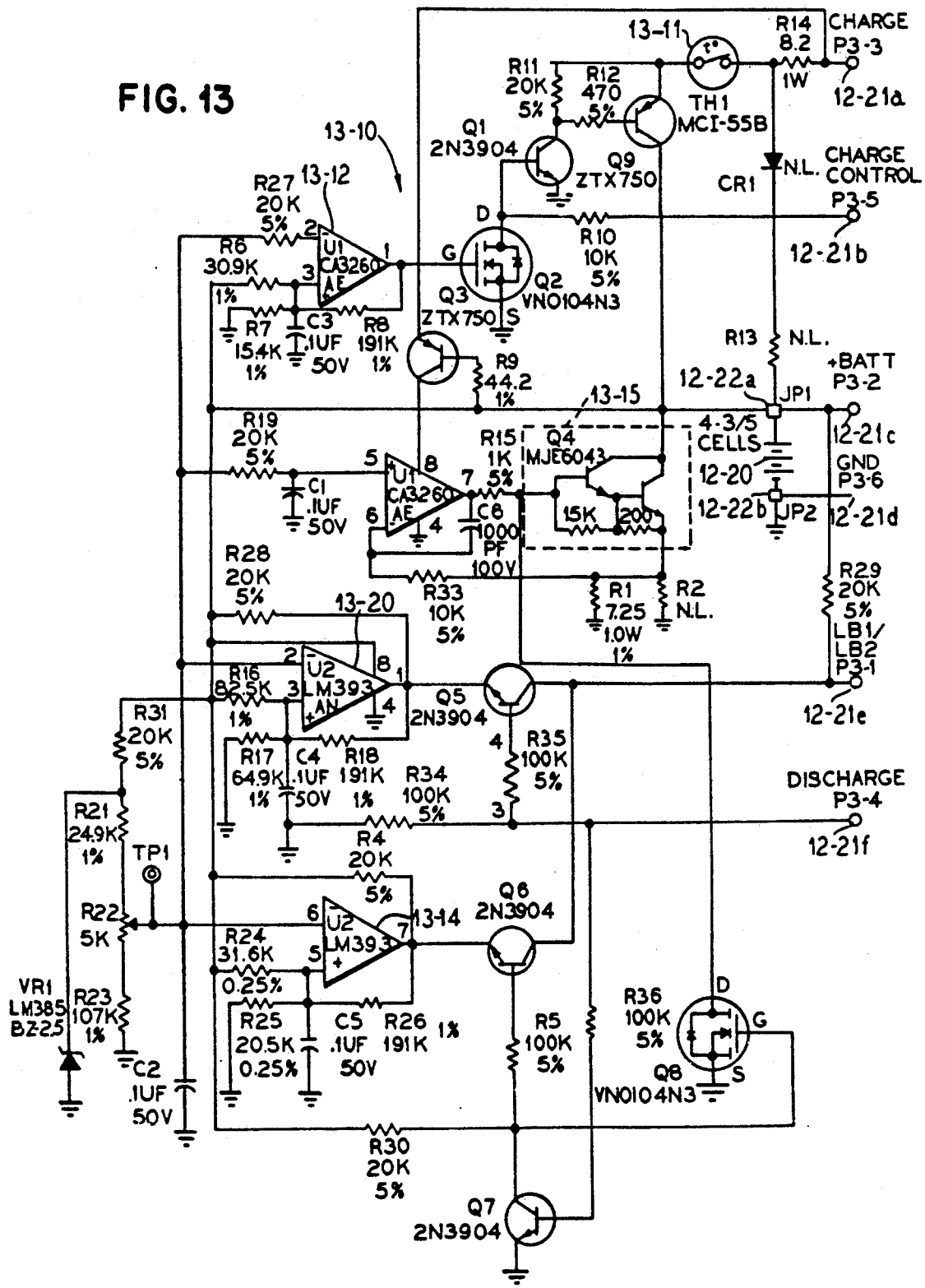
Figure 14:
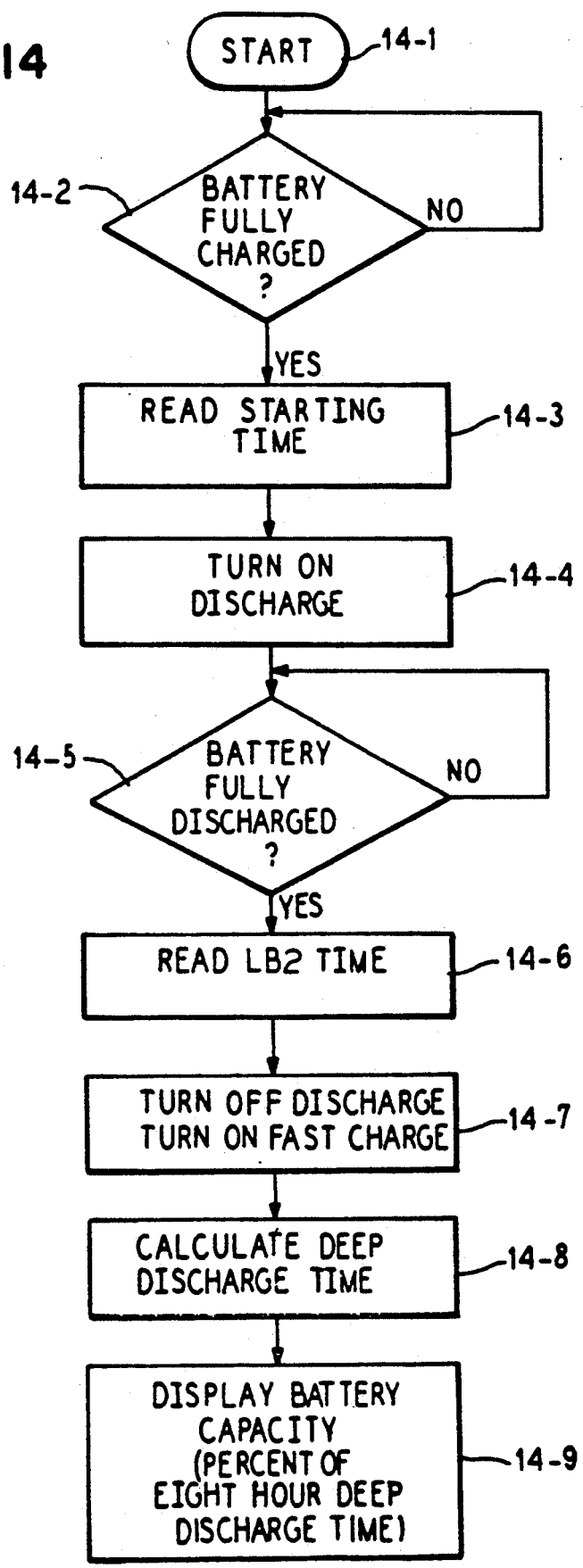
Figure 15:
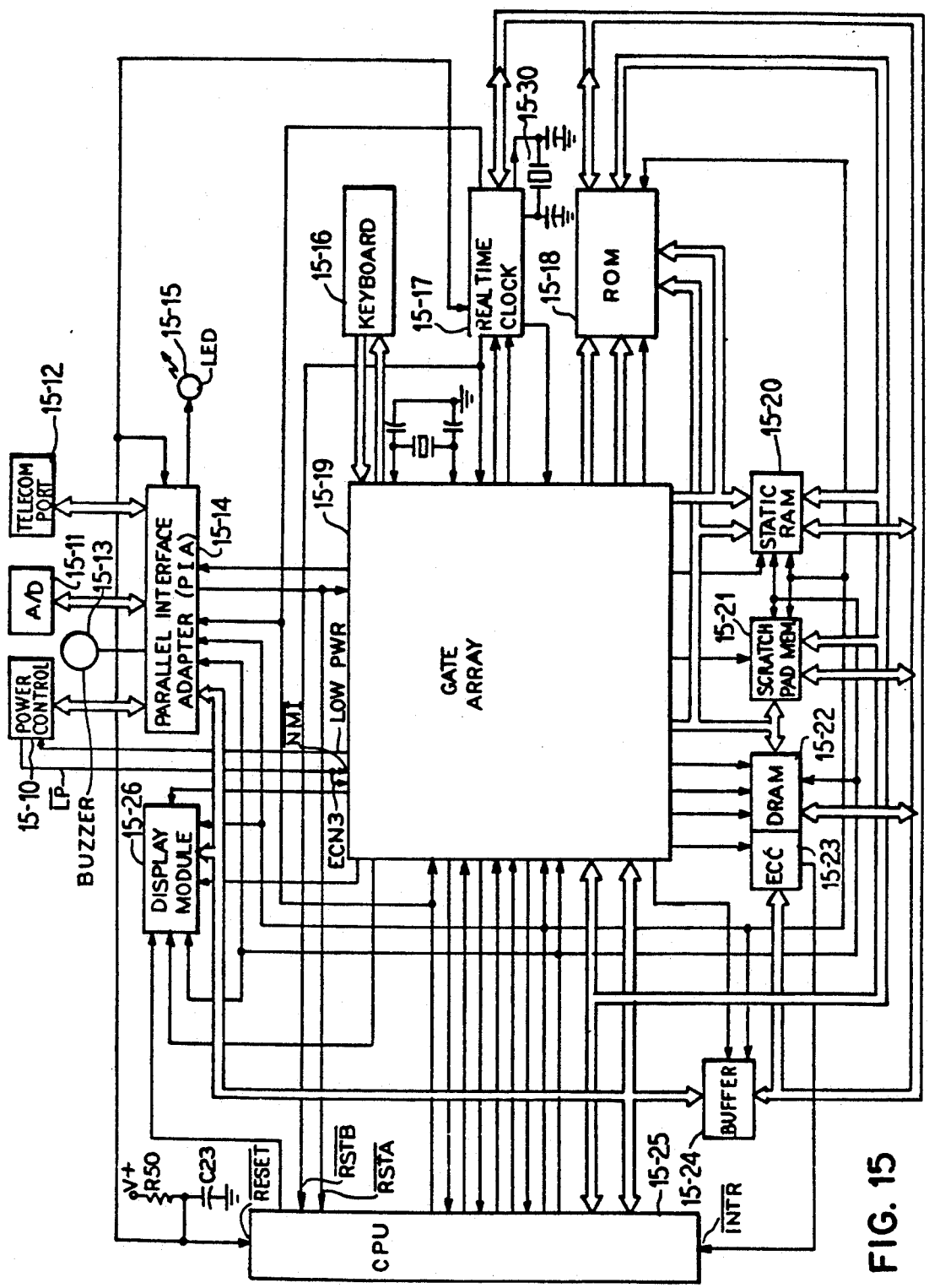
Figure 16A:
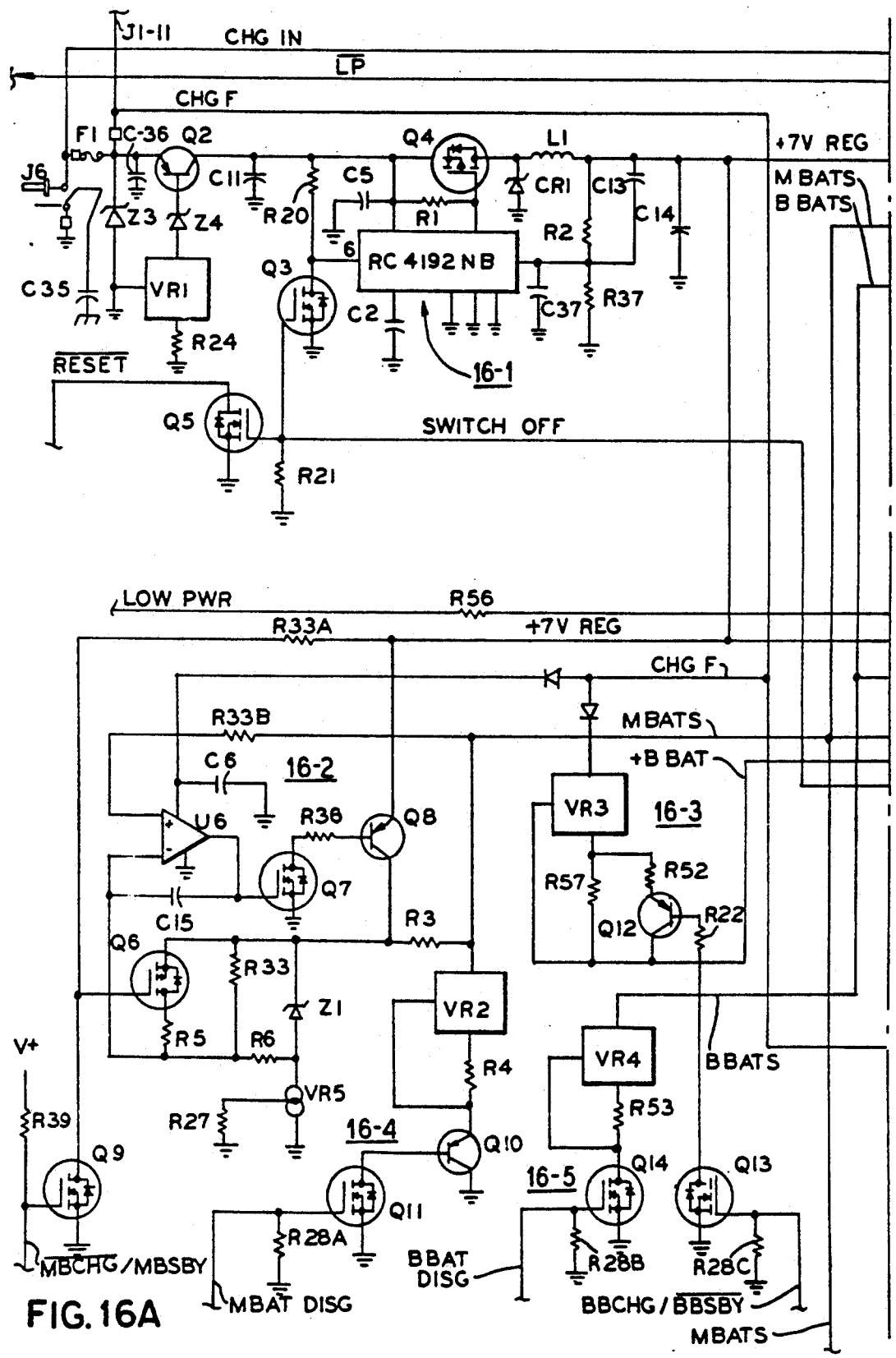
Figure 16B:
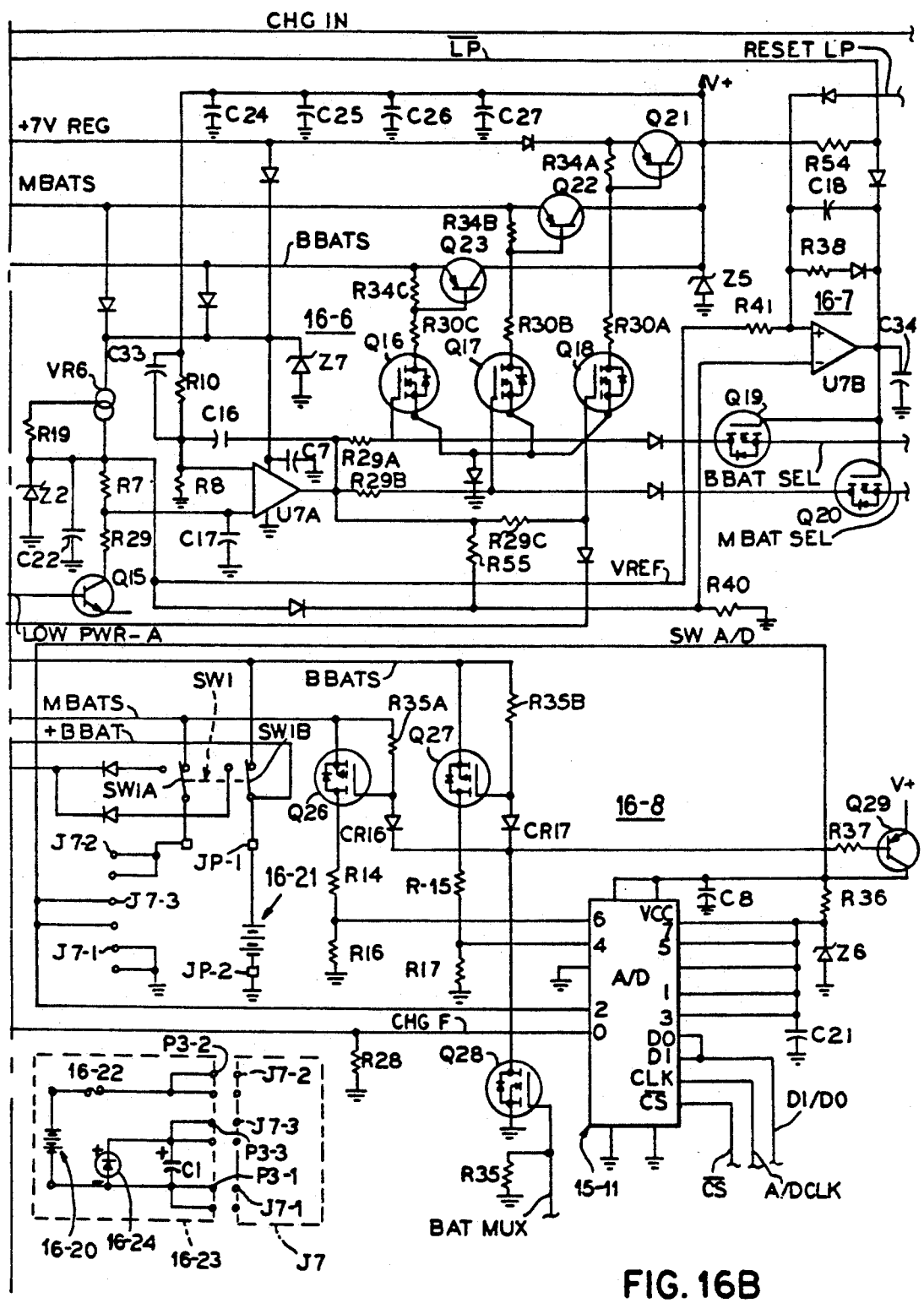
Figure 17:
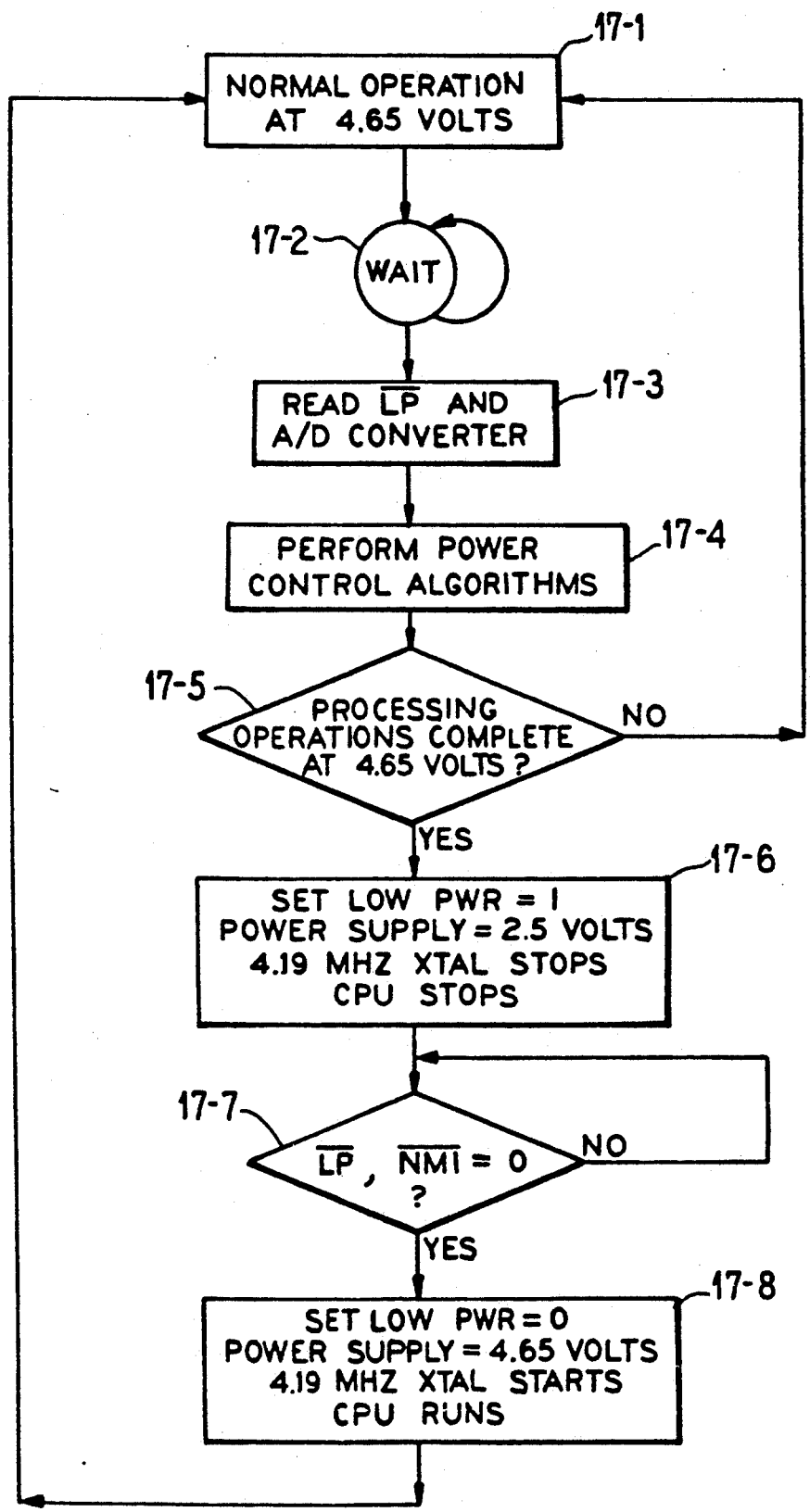

As a simplified example, processor means 18-10 may include a stored look up table wherein for respective temperature ranges, respective different settings for the desired average battery charging current are entered. An exemplary table based on FIG. 6 is as follows:

Exemplary Table Of Desired Average Battery Charging Current As A Function Of Temperature (See FIG. 6.)

| Temperature Range (°F.) | Average Battery Charging Current | Corresponding Nominal n Value |
| --- | --- | --- |
| Below 2.5 | Zero | 0 |
| 2.5 to 35 | C/100 | 1 |
| 35 to 76 | C/20 | 5 |
| 76 to 98 | C/10 | 10 |
| 98 to 112.5 | C/6.7 | 15 |
| Over 112.5 | Zero | 0 |

If at the initiation of a battery charging operation, the temperature were in the range from 76° F. to 98° F., then a number ten (n=10) would initially be inserted into a duty cycle register. At the start of each operating cycle, switch means 18-22 would be turned on, and clock pulses of clock oscillator 18-32 would be counted until the number corresponding to the n value stored in the duty cycle register was reached. Switch means 18-22 would then be turned off.

For the case of closed loop control, sampling would take place as shown in FIG. 21. After sample ns32, a value of actual charging current would be calculated. If for example, the average actual current were calculated at 0.10C, and the battery temperature remained in the same range of 76° F. to 98° F., there would be a zero error and the value of ten would remain in the duty cycle register.

With successive samples of actual battery current and successive temperature readings, if the actual battery current were found to increase to 0.11C, the error of 0.01C could cause one count to be subtracted from the duty cycle register. If a new temperature range were measured, then the corresponding nominal n value from the foregoing table could be inserted into the duty cycle register. A more sophisticated control procedure taking account of further variables and narrower temperature ranges can be readily constructed based on the foregoing explanation.

The microprocessor 22-16 may be programmed to sample battery current during deep discharge of the battery means and during portable operation to obtain a measure of remaining battery life which may be displayed by the portable unit. See for example, Tables A and B herein.

Features of a preferred implementation of FIGS. 18, 19 20A, 20B, 21 and 22 include the following by way of example and not of limitation:

(1) Constant frequency duty cycle repetition rate for Vsw, e.g. a fraction of the clock rate of component 18-32 corresponding to a desired number of modulation increments per cycle of Vsw.

(2) Digitally selectable duration for the active duty cycle of Vsw.

(3) Current in inductor 18-24 may reach zero before the end of each cycle of Vsw as illustrated in FIGS. 19 and 20B over a range of numbers of modulation increments including a maximum charging rate, e.g. C/8, for battery 18-20.

(4) Vsense at 18-38 is measured via a low offset voltage linear amplifier, a sample and hold circuit, and an analog to digital converter, e.g. as indicated in FIG. 22.

(5) Processor 18-20 obtains a measure of battery current during both battery charging and battery discharging operations.

(6) Current sense resistor 18-26 adds little to the resistance of battery means 18-20.

(7) The actual analog current pulse waveform in resistance 18-26 is deliberately under-sampled to alias the resultant waveform (as indicated in FIG. 21) to a very low frequency so that processor 18-10 can readily obtain a measure of average charging current without requiring a high processor operating rate.

(8) Processor 18-10 selects the duty cycle of Vsw according to ambient temperature to prolong battery life and enhance reliability of the complete hand held unit.

SUMMARY OF OPERATION

From one standpoint, the illustrated embodiment exemplifies a method of operation in a battery charging system wherein current is intermittently supplied from a voltage source means, e.g. V(+CHG), FIG. 18, to a chargeable battery means 18-20 via an energy storage means, e.g. inductance 18-24. The circuit arrangement is such that battery charging current continues to flow from the energy storage means to the battery means, e.g. via diode 18-36, at each interruption of the current flow at current regulator means 18-22. The intermittent actuation of current regulating means 18-22 produces a fluctuating battery charging current such as represented in FIGS. 19 and 20B which fluctuates in each of the successive operating cycles.

In order to obtain a measure of average battery charging current, the sampling means of component 18-10 is operated in an aliased asynchronous manner relative to the operating cycles of the battery charging current waveform such that battery charging current is sampled at respective different sampling times e.g. ts1, ts2, ts3, ..., FIG. 20B, in respective different operating cycles e.g. cycles S1, S65, S129, ..., FIG. 20A, over a certain aliased sampling time interval, e.g. as represented at ns1 to ns32, FIG. 21. Because of the clock rate of clock oscillator 18-32, FIG. 18, e.g. six megahertz, the waveform of each operating cycle such as shown in FIG. 19 could be sampled a number of times, e.g. at intervals of one-sixth microsecond, such intervals being termed potential sampling intervals. In aliased sampling however, a given cycle of the battery charging current may not be sampled at all, and for example, as shown in FIG. 20B, sampling may take place at intervals of about sixty-four operating cycles but asynchronously to the repetition interval of the operating cycles, so that successive actual sampling intervals such as ts1, ts2, ts3, ts4, ..., FIG. 20B, scan through the potential sampling points, in each of a succession of aliased sampling cycles, each such aliased sampling cycle having a duration, for example, greater than one millisecond (e.g. 43.696 milliseconds).

If, for example, the sampling takes place at N respective different potential sampling intervals, covering the potential sampling points of the operating cycle, then after N samples have been obtained, the sample values can be added and an average obtained as a measure of average battery charging current. With each new sample such as sample N plus one, the earliest sample, e.g. sample number one, can be discarded, and a new average value calculated.

In the exemplary embodiment, the battery or environmental sensing means 18-28 in conjunction with transducer 18-30 may measure an ambient temperature related to the temperature of the battery means 18-20 and determine an optimum battery charging rate based at least in part on the most recent measurement of battery temperature.

For example, for a given chargeable battery means the processor means 18-10 may be programmed to select a maximum battery charging rate consistent with assurance of prolonged battery life, e.g. avoiding an excessive overcharge rate as discussed in relation to FIG. 6.

As an example, processor means 18-10 may include a stored look up table wherein for each respective temperature range of significance, respective different settings for the desired average battery charging current are entered.

By way of example, where there is a number of potential discrete sampling intervals per operating cycle equal to the fifth power of two (32), sampling may be effected at time intervals equal to about the fifth power of two (32) times the duration of an operating cycle, or about the tenth power of two (1,024) times the duration of a discrete sampling interval. For the example of a clock rate of six megahertz, the potential discrete sampling intervals may have a duration of one-sixth microsecond (about 167 nanoseconds).

Thus, the time between samples may be substantially longer than one microsecond, e.g. of the order of one-sixth of a millisecond.

For the case where the clock time period is one-sixth of a microsecond, and the operating frame interval of an operating cycle is equal to e.g. the fifth power of two (32) times such clock time period, the operating frame period is itself greater than one microsecond (e.g. 5.33 microseconds).

It can be seen from FIG. 19 that where switch means 18-22 is to be operated with a maximum duty cycle limited to twenty clock period time intervals of one-sixth microsecond, the energy in the inductance 18-24 may be essentially dissipated in less than ten microseconds, for example in a time interval of about one-third microsecond.

From FIG. 19, it can be seen that with a duty cycle of fifty percent, i.e. with switch means 18-22 turned on for sixteen clock period intervals (about 2.67 microseconds), or even with a duty cycle of seventy percent, the current in inductance means 18-24 will be substantially zero at the end of the operating cycle.

With closed loop control of battery charging current, it would be feasible to have duty cycles of switch means 18-22 where appreciable current was flowing in inductance means 18-24 at the beginning of successive duty cycles, e.g. as indicated at 19-4, FIG. 19, since the sampling means of FIG. 22 would sample current over the entire operating cycle, and would provide a measure of total current flow in the battery means.

DEFINITION OF ALIASED SAMPLING MEANS

In the normal sampling of a periodically fluctuating current, a sufficient number of samples would be taken to obtain values in the vicinity of an abrupt change such as at 19-3, FIG. 19. With the exemplary waveform, such an abrupt change may take place at numerous discrete positions, suggesting a number of samples per cycle. An "aliased" sampling is one that takes place at intervals greater than the period of the fluctuating waveform.

Figure 23:
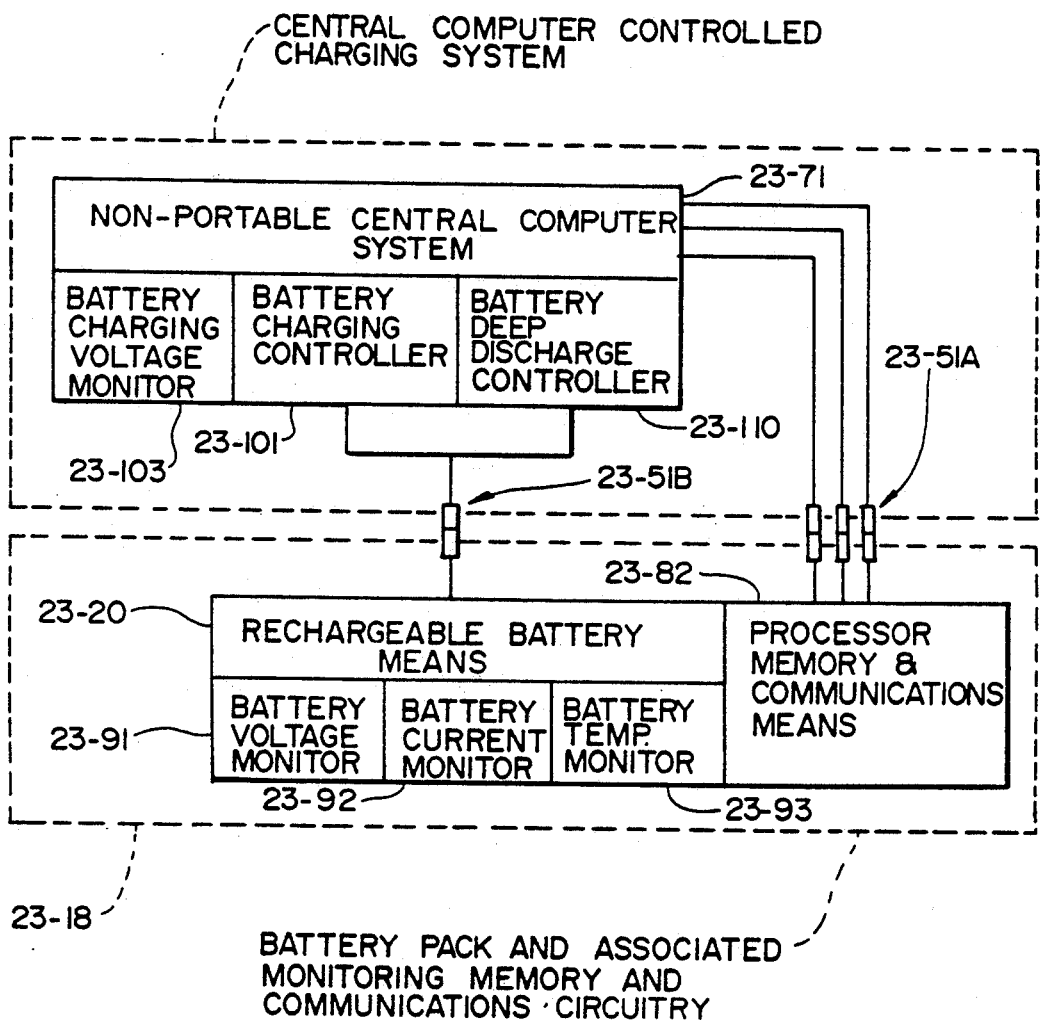
FIG. 23 illustrates a battery conditioning system as described at col. 17, lines 51–68 of the incorporated U.S. Pat. No. 4,455,523, and wherein two-way communication may be established between memory means associated with a portable unit comprised of rechargeable battery means, and a non-portable central computer controlled conditioning station.

Description of FIG. 23

FIG. 23 illustrates a non-portable system for inserting a measured value of battery capacity of a rechargeable battery means 23-20 into a memory of processor, memory and communications means 23-82 of the battery system indicated at 23-18, after each deep discharge cycle as effected by deep discharge controller 23-110. For example the deep discharge cycle of controller 23-110 and the charging cycle of charging controller 23-101 may be controlled by a separate non-portable computer system 23-71 at a central charging station. This computer system may be capable of communication with the memory of means 23-82 of the battery system via communications interface means 23-51A for inserting an accurate actual measurement of battery capacity. The central computer of non-portable computer system 23-71 may interrogate the memory of means 23-82 for relevant battery history and then selectively determine a suitable charging voltage and charging current at charging interface means 23-51B.

As will be explained with reference to FIG. 24, the memory of component 23-82 may contain a non-volatile read only memory which identifies the particular associated battery pack as to its capacity, rated voltage and other characteristics relevant to conditioning operations. Thus, where a series of different battery packs have respective read only memories identifying the same, the central charging station may interrogate the different battery packs coupled therewith and select charging and deep discharge cycle parameters according to the individual characteristics of the respective different battery packs.

Figure 5:
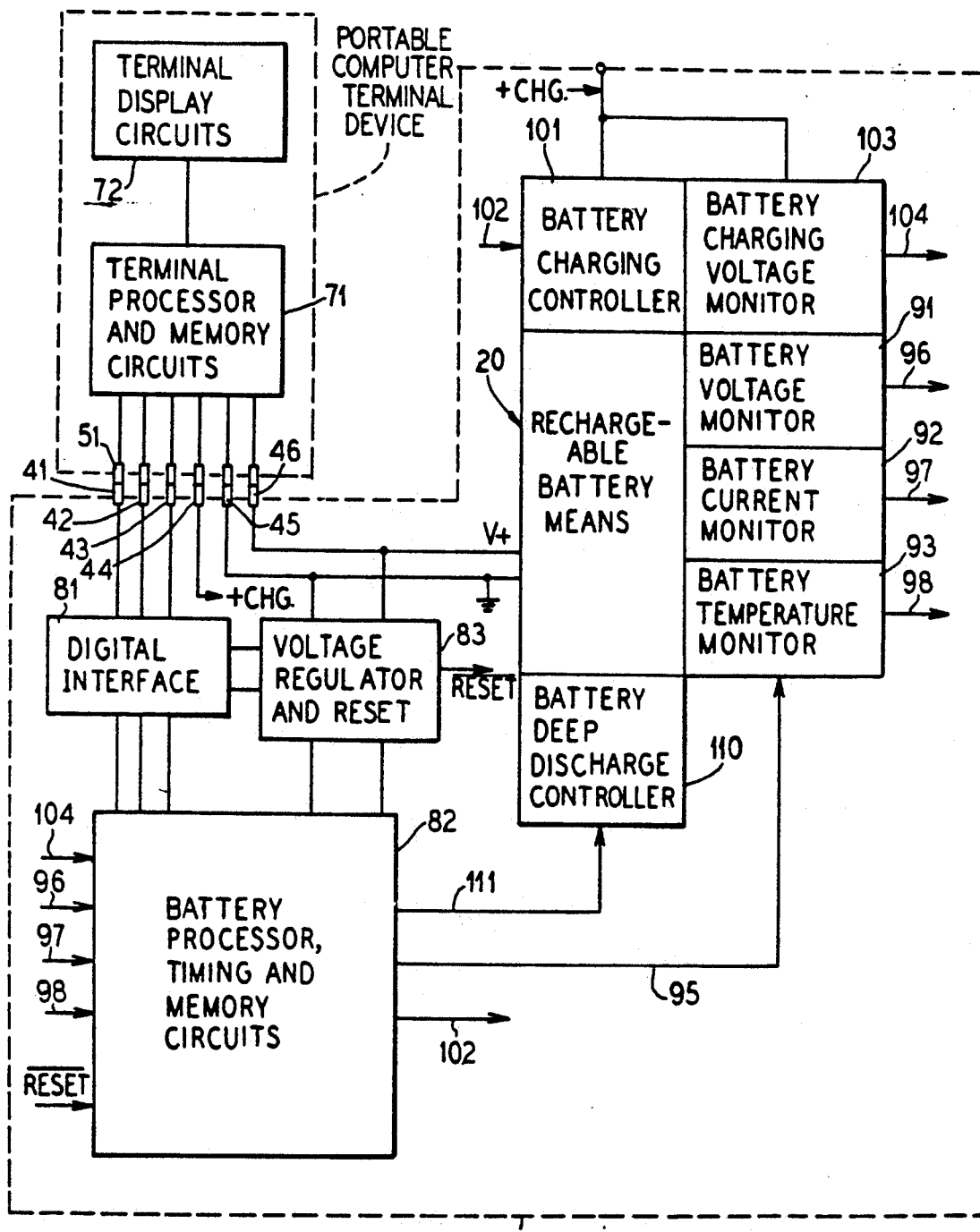

As will be apparent to those skilled in the art, the respective components of FIG. 23 may correspond with components of FIG. 5 as follows:

| Component of FIG. 23 | Corresponding Component or Components of FIG. 5 |
|---|---|
| Battery System 23-18 | Components 20 81-83 and 91-93 |
| Rechargeable Battery Mean 23-20 | Rechargeable Battery Means 20 |
| Memory and Communications Means 23-82 | Battery Processor, Timing and Memory Circuits 82, Digital Interface 81 and Voltage Regulator and Reset Component 83 |
| Battery Voltage Monitor 23-91 | Component 91 |
| Battery Current Monitor 23-92 | Component 92 |
| Battery Temperature Monitor 23-93 | Component 93 |

Components 23-71, 23-101, 23-103, and 23-110 may be analogous to components 71, 101, 103 and 110 in FIG. 5. Interface means 23-51A and 23-51B may be analogous to interface or connector means 51, FIG. 5.

Figure 24:
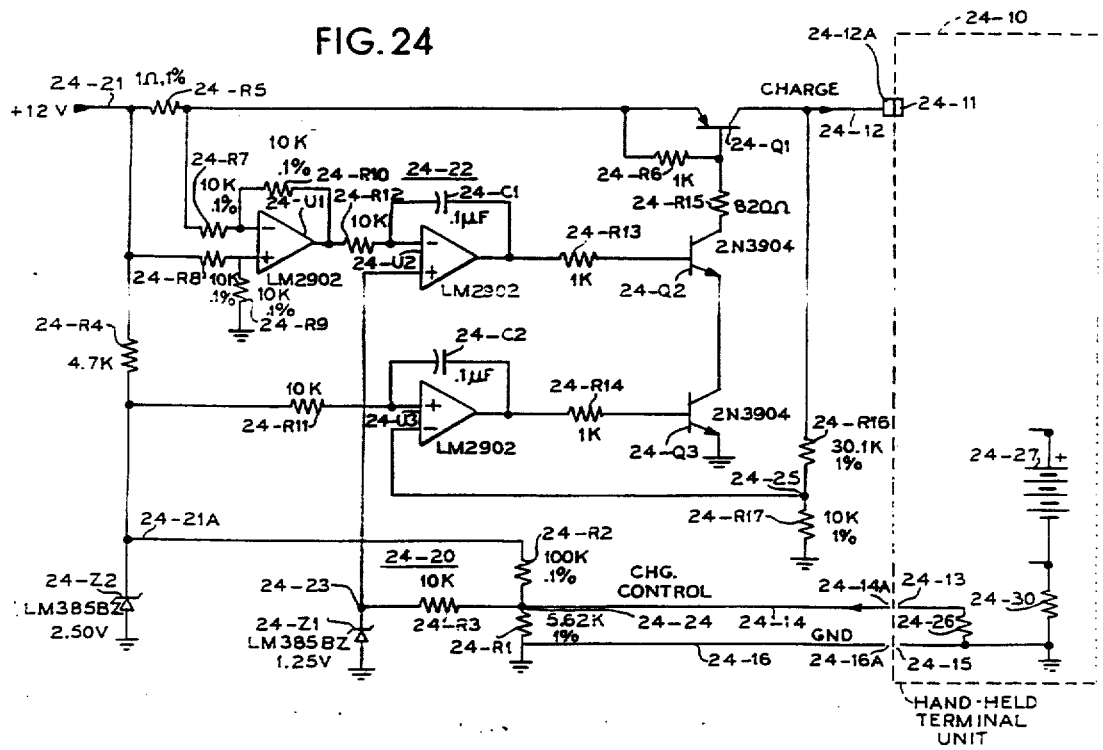
FIG. 24 shows a battery conditioning system wherein a battery identifying circuit element directly controls the set point of a battery charging circuit to determine a battery charging parameter, e.g., battery charging current.

Description of FIG. 24

FIG. 24 shows a battery conditioning circuit which may be utilized in place of the central computer controlled charging station of FIG. 23. The system of FIG. 24 may have a receiving device for a hand-held unit as described in Chadima et al U.S. Pat. No. 3,823,388 (e.g. in reference to the fifth figure thereof at col. 9, lines 20-31). See also a brochure of Norand Corporation entitled "Route Commander" Portable Data System for bakery distribution, No. 960-382-0884, copyright 1984, a copy of two sections thereof being included in Appendix A hereto.

When a hand-held device indicated at 24-10, FIG. 24, (such as shown in incorporated FIG. 1) is inserted into its receptacle, its charge input indicated at 24-11 is coupled with contact 24-12A, FIG. 24, of the CHARGE output line 24-12, and a further terminal contact 24-13 is coupled with contact 24-14A of the CHG CONTROL line 24-14. By way of example, the receptacle may receive different hand-held terminals with different battery configurations, and each configuration would provide a characteristic resistance value between the terminal ground contact such as 24-15 (connected with ground contact 24-16A of GND line 24-16) and the terminal charge control contact such as 24-13. The terminal resistance value is thus connected between contact 24-14A and the ground contact 24-16A, and in parallel with a resistor 24-R1 of a charge control reference network 24-20 which further includes resistors 24-R2, 24-R3 and zener 24-Z1. The network receives an activating potential from a charging supply input line 24-21 (+12V) via a charging supply potential responsive line 24-21A which is connected between a resistor 24-R4 and a zener 24-Z2.

The current flow path between the charging supply input line 24-21 and CHARGE output line 24-12 includes a charge current sensing resistor 24-R5 and a charge current regulating transistor 24-Q1. The value of charge current is controlled by means of a control circuit 24-22 which includes linear operational amplifiers 24-U1, 24-U2 and 24-U3, transistors 24-Q2 and 24-Q3, resistors 24-R6 through 24-R17, and capacitors 24-C1 and 24-C2. As an example, the linear operational amplifiers may receive a supply voltage of plus twelve volts (+12V) relative to ground potential from supply input 24-21, and may be of type LM2902.

It will be apparent to those skilled in the art that the charging current supplied by the circuit of FIG. 24 will increase for increasing potentials at control point 24-23 up to the limit potential of zener 24-Z1 (which may for example be 1.25 volts). If for example, the limit potential for zener Z4-Z2 is 2.50 volts, the maximum potential at circuit point 24-24 may be designated VR1 with an open circuit between contacts 24-14A and 24-16A. This potential VR1 is then progressively reduced for respective terminal resistance values between about three times the value of 24-R1 (e.g. 5.62 kilohms plus or minus one percent) and about one-third the value of 24-R1, for example.

Exemplary circuit parameters for FIG. 24 are as follows (the letter K standing for kilohms):

| Exemplary Circuit Parameters, FIG. 24 | |
|---|---|
| 24-U1, 24-U2, 24-U3 | Type LM2902 |
| 24-Q1 | power transistor |
| 24-Q2, 24-Q3 | Type 2N3904 |
| 24-R1 | 5.62K (1%) |
| 24-R2 | 100K (1%) |
| 24-R3 | 10K |
| 24-R4 | 4.7K |
| 24-R5 | one ohm (1%) |
| 24-R6 | one kilohm (1K) |
| 24-R7, 24-R8, 24-R9, 24-R10 | 10K (.1%) |
| 24-R11, 24-R12 | 10K |
| 24-R13, 24-R14 | one kilohm (1K) |
| 24-R15 | 820 ohms |
| 24-R16 | 30.1K (1%) |
| 24-R17 | 10K (1%) |
| 24-C1, 24-C2 | .1 microfarad |
| 24-Z1 | LM385BZ (1.25 volts) |
| 24-Z2 | LM385BZ (2.50 volts) |

Summary of Operation for FIG. 24

In operation, respective different terminals 24-10, (such as terminal 10 of incorporated FIG. 1), having respective different charging current requirements are provided with respective corresponding ohmic resistance values between their contacts such as indicated at 24-13 and 24-15, FIG. 24. Thus each respective different terminal 24-10 will automatically produce the respective required charging current by virtue of the action of control circuit 24-22.

If the charging potential at output 24-12 tends to increase beyond its rated value, the potential at circuit point 24-25 tends to increase, decreasing the turn on potential supplied to transistor 24-Q3 by amplifier 24-U3.

The potential at 24-24, FIG. 24 may be coupled with a central computer system such as 23-71 via an analog to digital converter so as to identify the type of battery means to the central computer. The resistance between terminals 24-13 and 24-15 would normally be a resistor such as indicated at 24-26 fixedly associated with the battery means such as indicated at 24-27, so that replacing a battery means in a given terminal with a battery means of different ampere-hour capacity would automatically change the resistance value engaged with terminal contacts 24-13, 24,15. The computer system 23-71 of FIG. 23 in this modification, would thus receive an identification of battery capacity along with other battery parameters, and control battery conditioning (e.g. deep discharge) according to relevant parameters including battery capacity, while battery charging would be automatically controlled by a circuit such as shown in FIG. 24.

Figure 25:
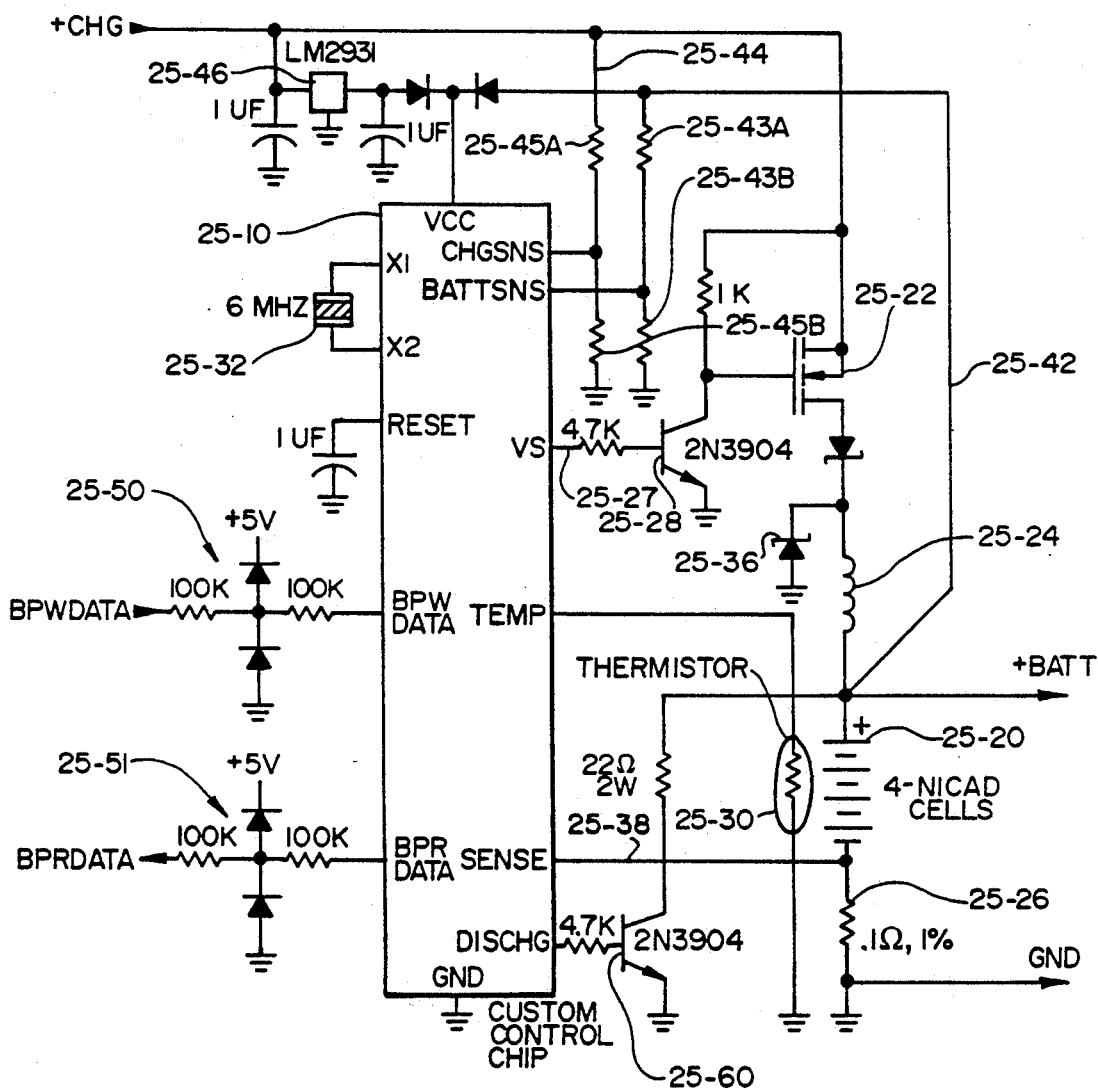
FIG. 25 shows a highly integrated semiconductor device, e.g. for implementing the system of FIGS. 18-22.

Description of FIG. 25

In FIG. 25, component 25-10 is a custom control chip for integrating the functions of components 18-10 and 18-28, FIG. 18, into a single monolithic semiconductor element. The external path for supplying charging current to battery 25-20 includes transistor 25-22, inductor 25-24 and charging current sensing resistor 25-26 which may correspond with components 18-22, 18-24 and 18-26, FIG. 18. A pulse width modulated output corresponding to that shown in FIG. 20A, is supplied at VS output 25-27 of chip 25-10 for controlling the on-time of transistor 25-28 which in turn controls the switching action of transistor 25-22. Components 25-30, 25-32 and 25-36 may essentially correspond with components 18-30, 18-32 and 18-36 in FIG. 18.

Charging current sensing input 25-38 may correspond with input 18-38, FIGS. 18-22, and may control circuitry of chip 25-10 such as represented by components 22-10, 22-14, 22-16 and 22-18, FIG. 22. The chip 25-10 is shown as sensing battery voltage (+BATT) via a line 25-42 and a first resistance voltage divider 25-43A, 25-43B, and is shown as sensing charging input potential (+CHG) via a line 25-44 and a second resistance voltage divider 25-45A, 25-45B.

Operating potential (VCC) is supplied to chip 25-10 from charging input potential (+CHG) via a voltage regulator 25-46.

Data communications e.g. between chip 25-10 and a central computer system such as 23-71, FIG. 23, may take place via stage 25-50 for data reception (BPWDATA) and via stage 25-51 for data transmission (BPRDATA).

Chip 25-10 may control battery discharge conditioning via transistor 25-60.

The operation of FIG. 25 will be apparent from a consideration of the preceding Description of FIGS. 18, 19, 20A, 20B, 21 and 22.

Figure 26:
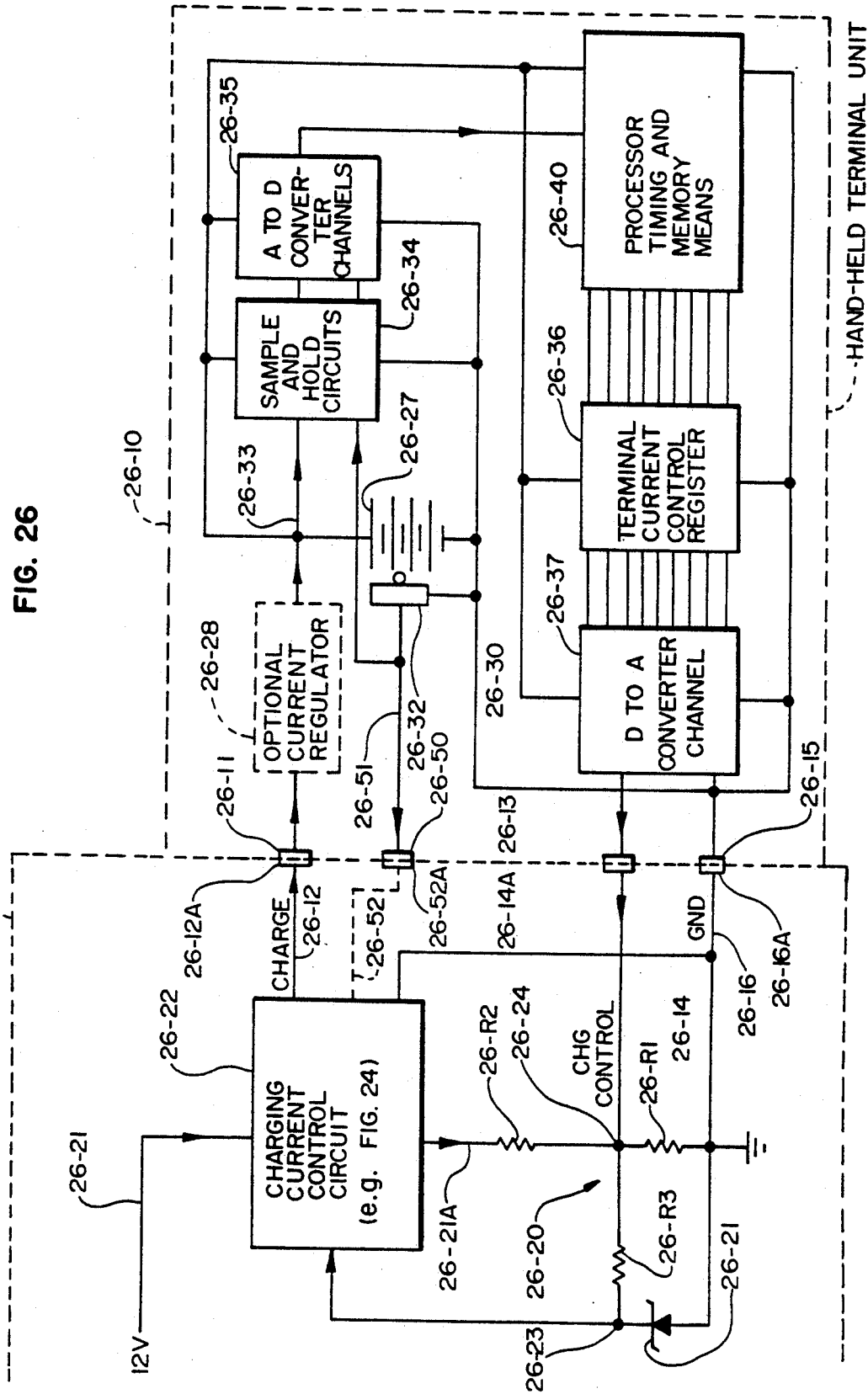
FIG. 26 is an electric circuit block diagram showing a battery conditioning system wherein a preferred hand-held terminal unit contains battery parameter sensing means and computer operating means for optimizing battery charging current as supplied by an external circuit (which may correspond with a standardized circuit such as shown in FIG. 24 applicable to a complete family of hand-held terminals)

Description of FIG. 26

FIG. 26 shows a preferred form of hand-held terminal unit 26-10 which may be associated with an external conditioning circuit such as shown in FIG. 24 by means of respective sets of mating contacts 26-11, 26-12A; 26-13, 26-14A; 26-15, 26-16A; in the same way as described for FIG. 24. Charging current is supplied to terminal unit 26-10 via CHARGE line 26-12, and an analog charge rate control signal may be applied from terminal unit 26-10 to CHG Control line 26-14, while terminal ground is connected with GND line 26-16 of the conditioning station.

As in FIG. 24, a charge control reference network 26-20 may comprise a resistance network 26-R1, 26-R2 and 26-R3 and a zener 26-z1 for receiving activating potential from a charging supply input line 26-21 (+12V) via a charging supply potential responsive line 26-21A. A charging current control circuit 26-22 may correspond with that of FIG. 24 and controls the charging current supplied via line 26-12 in accordance with a control signal potential at 26-23.

As in FIG. 24, resistance network 26-20 serves as a control signal generating network which provides a default value of control signal at circuit point 26-23 in the absence of any modifying input from a hand-held terminal unit. By way of example, both for FIGS. 24 and 26, older model terminal units may present an open circuit to station contacts 24-14A, 24-16A or 26-14A, 26-16A, and the generating network 24-20 or 26-20 by itself may provide a default value of control signal which results in the supply of a generally suitable value of charging current at 24-12 or 26-12, say 130 milliamperes.

In FIG. 26, the potential at circuit point 26-24 may be modified from the default value according to information and programming carried by the terminal unit, for example to produce a rapid charge rate, a moderate charge rate or a maintenance charge rate in dependence on the battery parameters of the terminal battery means 26-27, ideally so that an optimum charging rate is selected. Such charging rate can in principle take account of the load to be presented to the charging circuit by components of the terminal unit which will be functioning during the charging operation, e.g. terminal circuits for effecting a downloading of data from the memory of the terminal unit.

In a preferred example, the charging current path in FIG. 26 may include an optional current regulator 26-28 which is part of the portable terminal unit. The current regulator 26-28 could be present in cases where the terminal might be charged by means of a charging circuit without the current control features of circuit 26-22. For the sake of simplicity and economy, it is preferred that current regulator 26-28 be unnecessary, (because of the use of a charger configuration such as shown in FIGS. 24 and 26) and therefore preferably current regulator 26-28 is omitted, and line 26-33 is directly connected with contact 26-11.

The negative terminal of the battery means is preferably returned directly to ground potential as indicated at 26-30, without the presence of a current sensing resistor such as indicated at 25-26, FIG. 25. Correspondingly current sense resistor 24-30, FIG. 24, may be short circuited, particularly where the terminal processor means is programmed to accumulate a measure of battery usage. Omission of a current sense resistor such as 24-30 is particularly advantageous where the battery is to supply relatively high peak current as in portable radio frequency (RF) terminals which communicate data on line to a base computer station an RF link.

In the preferred example of FIG. 26, battery parameter sensing means are illustrated, comprised of a temperature transducer 26-32 for obtaining a measure of battery temperature, and a battery potential sensing line 26-33 for sensing battery terminal voltage. As in FIG. 25, components 26-34, 26-35, 26-36 and 26-37 may be on a single semiconductor chip with processor, timing and memory means 26-40 of the portable unit. Components 26-35 and 26-36 correspond with components 22-14 and 22-18 of FIG. 22 and comprise battery parameter input means for supplying measures of battery temperature and battery terminal voltage e.g. in binary digital format to the processor and memory components. Component 26-40 may include the clock-controlled microprocessor corresponding to 22-16, FIG. 22, and the interconnections of FIG. 22 have been omitted in FIG. 26 for simplicity of illustration.

According to a feature of the present invention, temperature transducer 26-32 may have its signal coupled to a further contact 26-50 via a line 26-51. Thus where a charger is present with a cooperating contact 26-52A and a line 26-52, the control circuit 26-22 can itself adjust charging current according to battery temperature. Further, the presence of a nonzero potential at line 26-51 may indicate that operating potential has been applied to transducer 26-32 from a charger circuit. (See e.g. the specific circuit of FIG. 27.)

Figure 27:
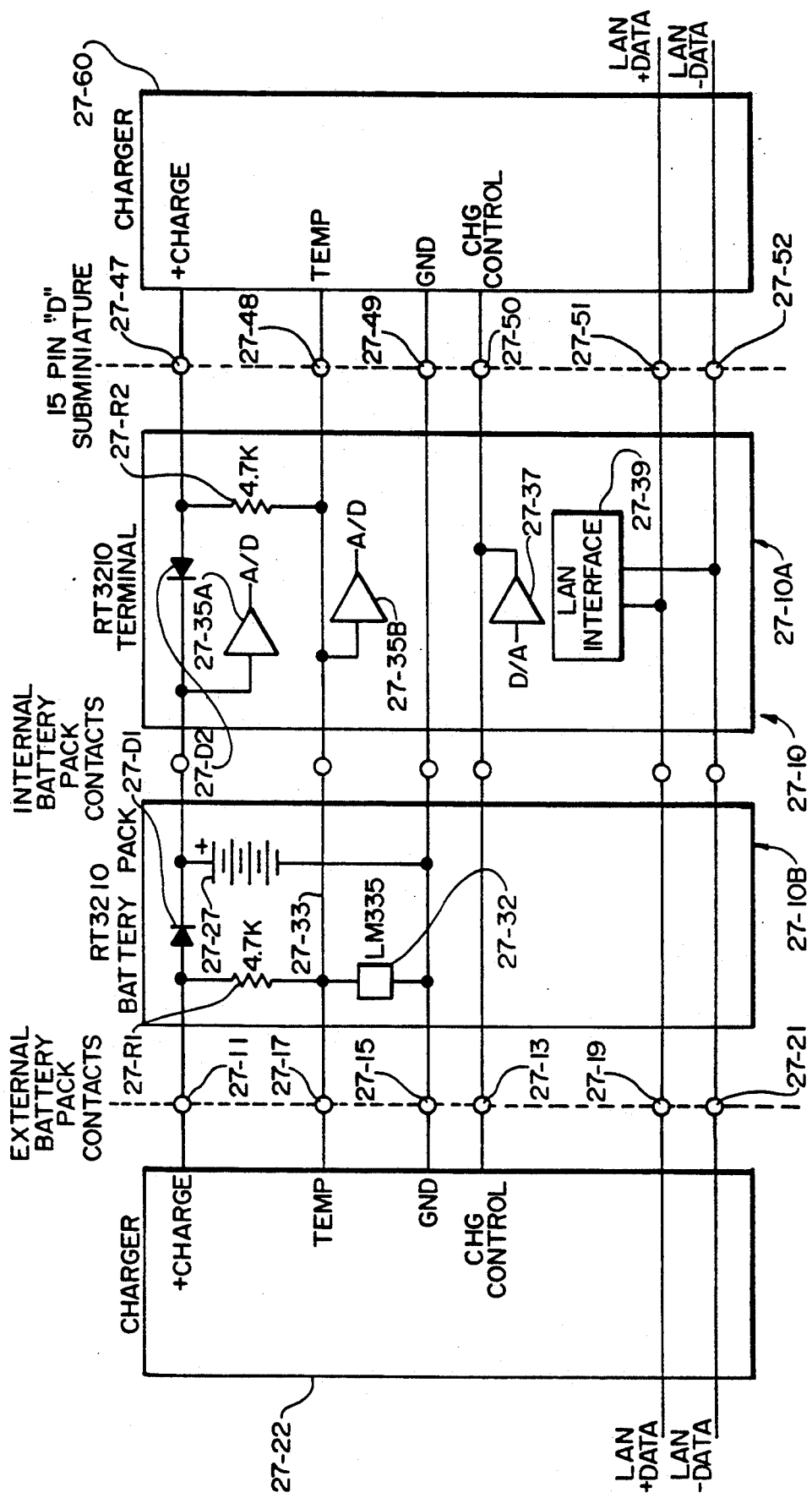
FIG. 27 shows a new RF terminal unit including charge control and temperature transducer outputs as in FIG. 26, and also incorporating an interface for coupling with a local area network so as to enable batch transmission of data to and from the RF terminal.

Description of FIG. 27

FIG. 27 illustrates a new RF terminal unit which may be associated with a non-portable battery conditioning system in a similar way as FIG. 26. In particular, FIG. 27 diagrammatically illustrates an RF terminal system 27-10A which removeably receives a rechargeable battery pack 27-10B. By way of example, the rechargeable batteries may be contained in a removeable drawer as illustrated in pending application of George E. Chadima, Jr., et al, U.S. Ser. No. 104,653 filed Oct. 2, 1987, and entitled "HAND-HELD COMPUTER SYSTEM", and this disclosure is incorporated herein by reference in its entirety. As illustrated in the tenth figure of the incorporated application Ser. No. 104,653, an end cap of the RF terminal unit may be provided with conventional contactors such as indicated at 27-11, 27-13, 27-15, 27-17, 27-19 and 27-21, which provide for quick connection with the battery pack and terminal circuitry simply by placing the terminal assembly into a suitable receptacle, for example, in a delivery vehicle or the like. The delivery vehicle may be provided with a charger circuit such as indicated at 27-22 which may be provided with a conventional terminal unit receptacle similar to that shown in page A2 of Appendix A hereto, which receptacle is provided with contacts for quick release engagement with the terminal contacts 27-11 etc. The battery pack may be provided with a rechargeable battery 27-27 and a temperature transducer 27-32, e.g. a solid state type LM335. The terminal assembly designated generally 27-10 further is indicated as including a resistor 27-R1 and a diode 27-D1 in the battery pack and a corresponding resistor 27-R2 and a corresponding diode 27-D2 in the terminal itself. It will be noted that the potential across transducer 27-32 will be zero until such time as a charge potential is applied at contact 27-11, so that the presence of a potential different from zero volts at contact 27-17 and at line 27-33 will indicate application of charging potential to the assembly 27-10. The circuitry at 27-35A and 27-35B in FIG. 27 may correspond with the circuitry 26-34 and 26-35 in FIG. 26, and may represent suitable commercially available integrated circuit for sensing analog values of battery terminal voltage and temperature, and for supplying corresponding digital values to a terminal processor such as indicated at 26-40 in FIG. 26. Component 27-37 in FIG. 27 may correspond with components 26-36 and 26-37 in FIG. 26 and may receive an output control word from a processor corresponding to 26-40 in FIG. 26 for establishing a desired control signal potential at contact 27-13 as described in detail with reference to FIG. 26.

Furthermore, the processor circuit of FIG. 27 may be provided with a local area network (LAN) interface 27-39 for communication with exterior devices via contacts 27-19 and 27-21, for example. Thus the terminal 27-10A is not only provided with RF circuitry and antenna means for on-line data interchange with a RF base station, but further the plug-in contacting of the terminal body at 27-19 and 27-21 provides for batch type transmission between the terminal 27-10 and an exterior station, permitting the batch type downloading of data, for example programming, into the terminal 27-10, and the batch type uploading of stored data from the terminal to an external station, for example a printer of a vehicle such as previously mentioned.

The incorporated patent application Ser. No. 104,653 shows in the tenth figure a fifteen pin "D" subminiature connector. Certain pins of this connector are indicated at 27-47 through 27-52 in FIG. 27, so that the terminal 27-10 can be coupled by means of such connector with a charger circuit such as indicated at 27-60, for example by means of a suitable connecting cable or the like. The charger circuit 27-60 may correspond with the charger circuit of FIG. 24 or FIG. 26, for example, and may include components connected to the local area network interface 27-39 via contacts 27-51 and 27-52.

It will be apparent that the local area network interface 27-39 may be utilized to transmit to the charger 27-22 or 27-60 battery information such as rated battery capacity and hours of use subsequent to a previous charge as explained in detail with respect to FIGS. 23 and 26.

Discussion of FIGS. 23 through 27

The processor of components 23-71, 25-10, 26-40 or of FIG. 27 can be programmed with a schedule of battery charging currents as a function of temperature such as described with reference to FIGS. 18–22. As another example, reference is made to the lookup table of Appendix B (page B10 of APPENDIX B). Generally the charging rate can be adjusted according to a quantitative measure of battery temperature so as to achieve a maximum charging rate consistent with the specific characteristics of the battery means 23-20, 25-20, 26-27 or 27-27.

Where battery terminal voltage is measured, abnormally high or low values may represent a defective battery or short circuit, so that the processor of component 23-71, 25-10, 26-40, or of FIG. 27 would be programmed to provide a shutoff control potential for the charging circuit. For example, in FIG. 26, a maximum potential from the converter channel 26-37 could establish a control potential at circuit point 26-23 of 1.25 volts, the limit potential of zener 26-Z1, and produce zero charging current (corresponding to a shut-off of transistor 24-Q1, FIG. 24).

Where the processor and memory means of component 23-82, FIG. 23, or 26-40, FIG. 26, or of FIG. 27 keeps track of usage of the hand-held terminal unit in the portable (off the charger) mode, the accumulated hours of use along with rated battery capacity can be transmitted to the central computer system 23-71 at the start of a conditioning operation, or can be utilized in selecting a suitable computer generated control word for register 26-36 in FIG. 26 or for component 27-37, FIG. 27. As described in incorporated U.S. Pat. No. 4,553,081 (at col. 45, line 58 et seq.), when the terminal unit 26-10 or 27-10 is unplugged from the conditioning station, the processor e.g. of 26-40 may increment an elapsed time counter (e.g. a register or memory location of 26-40) by a constant of two minutes for every minute off charge, until a maximum of twelve hours has been incremented (six hours of real time). When the terminal unit again is plugged into the charger circuit (such as 26-22 or 27-22) the CPU e.g. of 26-40 may then decrement from the incremented amount to determine charge time, or transmit the incremented amount as battery information to the central computer of 23-71, FIG. 23. As previously a maximum charge time of twelve hours may be set as the incremented amount if the unit should be deactivated, e.g. by turning off battery power in the field. (See also col. 47, lines 36-53 of incorporated U.S. Pat. No. 4,553,081.)

Generally, the processor of each portable terminal unit may store battery information such as indicated in TABLE B of incorporated U.S. Pat. No. 4,553,081 (col. 14, line 40-col. 15, line 58), and battery information may be transmitted to an external processor e.g. of component 23-71, FIG. 23, when the terminal unit is plugged into a conditioning station preparatory to conditioning operation, and in any case the stored data may be used as battery information in the generation of charging current control signals, e.g. in the embodiments of FIGS. 23, 25, 26 and 27.

Generally, communication between a processor, e.g. of components 18-10, 23-82, 25-10, 26-40, or of FIG. 27, and an external station may include the types of commands given in TABLE A of incorporated U.S. Pat. No. 4,553,081 (col. 14, line 14-39).

In each of the embodiments of incorporated U.S. Pat. No. 4,553,081 referring to charging of a spare battery pack (e.g. col. 19, line 61 to col. 20, line 4; and col. 48, line 31 to col. 49, line 53), the same description may apply to charging of a plug-in portable terminal unit, e.g. generally as in FIG. 23, FIG. 26 or FIG. 27. (At col. 49, line 10, "C/B" should read—C/8—; see application U.S. Ser. No. 612,588 filed May 21, 1984, page 76, line 12.)

In the interest of supplying further exemplary detail concerning battery conditioning operation, flowcharts, timing diagrams and an exemplary lookup table, suitable for the processor of a portable terminal unit such as processor 14 of FIGS. 1-12, or of 18-10, FIG. 18, or of 26-40, FIG. 26, or of FIG. 27, and also suitable for a central processor such as 23-71, FIG. 23, are shown in APPENDIX B hereto (pages B1 to B10 following the ABSTRACT OF THE DISCLOSURE). This information was generated for the battery processor 140, FIG. 9B, but was not originally included since it was not considered to be required for practicing this mode of the invention.

It will be apparent that the various modifications and features previously mentioned can be incorporated with one or more features of FIGS. 18, 19, 20A, 20B, and 21-27. For example, the system of FIGS. 18-22 or 25 may form a part of a stationary battery charging system which removably receives spare battery packs, and/or which removably receives hand-held units such as shown in FIG. 1. The processor means 18-10 or 25-10 as the main processor of a hand-held terminal unit may measure actual battery discharge current during use of the hand-held unit and then control the duration of recharging according to such measure, and/or according to rated battery capacity as stored in a read only memory of the main processor, or the like. Many further modifications and variations will readily occur to those skilled in the art from a consideration of the teachings and concepts of the present disclosure.

I claim as my invention:

1. A portable battery powered system comprising a portable battery powered utilization device operating from battery power during portable operation, battery means operatively coupled with said utilization device for supplying operating power thereto during portable operation, and conditioning control means comprising computer operating means having computer output means for coupling with an external battery conditioning circuit during conditioning of the battery means, with said computer operating means of said portable utilization device supplying a computer generated control signal according to rated battery capacity of said battery means, to an external battery charging circuit to control charging current supplied to said battery means during battery charging operation.

2. In a portable battery powered system,
   a portable battery powered utilization device for operating from battery power during portable operation thereof,
   battery means operatively coupled with said utilization device for supplying operating power thereto, and
   battery monitoring means operatively coupled with said battery means for monitoring battery operation,
   said utilization device together with said battery means and said battery monitoring means having a size and weight to be carried by an individual person, and
   said battery monitoring means comprising memory means operative for storing data based on said battery operation and representative of available battery capacity, and
   means comprising said memory means for indicating remaining battery capacity.

3. A portable battery powered system in accordance with claim 2, with
   said utilization device comprising data processing means operatively coupled with said battery means for operation from battery power,
   said battery monitoring means having data communication means operatively coupled with said data processing means of said utilization device, and providing for the transmission of data messages to said data processing means concerning available battery capacity.

4. A portable battery powered system according to claim 2, with
   said utilization device comprising data processing means operatively coupled with said battery means for operation from battery power,
   said data processing means requiring a minimum battery voltage value from said battery means, and
   said memory means being electrically connected with said battery means for receiving operating power therefrom during portable operation of said utilization device and being operable with a battery voltage substantially less than said minimum battery voltage value.

5. A portable battery powered system according to claim 2, with said battery monitoring means comprising battery charge flow measurement means operatively coupled with said battery means for measuring the charge flow from the battery means during portable operation of said utilization device and for supplying battery charge flow data to said memory means, said memory means being operatively coupled with said battery charge flow measurement means for storing data representative of the quantities of charge supplied by said battery means during a portable operating cycle thereof.

6. A portable battery powered system according to claim 2, further comprising
charging control means operatively coupled with said battery means for controlling the rate of charging of said battery means.

7. The battery monitoring means of claim 2 wherein the battery monitoring means stores data related to the remaining capacity of said battery means for visual display to the operator of said portable battery powered utilization device.

8. The battery monitoring means of claim 2 wherein the battery monitoring means collects and stores data related to the remaining capacity of said battery means for use by the battery conditioning circuitry.

9. The battery monitoring means of claim 2 wherein said capacity is a nominal capacity of the battery means.

10. The battery monitoring means of claim 2 wherein said capacity is a measured capacity of said battery means.

11. The battery monitoring means of claim 2 wherein the remaining battery capacity is equal to nominal capacity of said battery means minus net charge supplied by said battery means subsequent to fully charging said battery means.

12. The battery monitoring means of claim 2 wherein said remaining capacity is given by the measured capacity of said battery means minus net charge supplied by said battery means subsequent to said battery means being fully charged.

13. The battery monitoring means of claim 2 wherein said storage means is a nonvolatile memory storage means.

14. The battery monitoring means of claim 6 wherein said charging control means pulse-width-modulates said charging current in order to supply a desired average charging current to said battery means.

15. The battery monitoring means of claim 2 wherein the battery monitoring means includes display means for allowing a human sensory perception of remaining battery capacity.

16. In a portable battery-powered system a portable battery-powered utilization device for operating from battery power during portable operation thereof;
battery means operationally coupled with said utilization device for supplying operating power thereto; and battery monitoring means operationally coupled with said battery means for monitoring battery parameters which include inherent battery capacity, rate of discharge, and elapsed time relative to said rate of discharge;
said utilization device together with said battery means and said battery monitoring means having a size and weight to be carried by an individual person; and
said battery monitoring means comprising battery parameter sensing means for sensing battery parameters, memory means operationally coupled with said battery parameter sensing means operative for storing data based on said battery parameters which include battery parameters which are representative of said battery state of charge, and means comprising said memory means for indicating said battery means' state of charge.

17. A portable battery-powered system in accordance with claim 16 wherein;
said utilization device comprising data processing means is operatively coupled with said battery means for operation from battery power;
said battery monitoring means having data communication means operatively coupled with said data processing mean of said utilization device and providing for the transmission of data messages to said data processing means concerning state of charge of the battery means.

18. A portable battery-powered system according to claim 16 wherein;
said utilization device comprising data processing means is operatively coupled with said battery means for operation from battery power;
said data processing means requiring a minimum battery voltage value from said battery means; and
said memory means electrically connected with said battery means for receiving operating power therefrom during portable operation of said utilization device and being operable with battery voltage substantially less than said minimum battery voltage value.

19. A portable battery-powered system according to claim 16 wherein said battery parameter sensing means comprises battery charge flow measurement means operatively coupled with said battery means for measuring charge flow from the battery means during portable operation of said utilization device and for supplying battery charge flow data to said memory means, said memory means being operatively coupled with said battery charge flow measurement means for storing data representative of quantities of charge supplied by said battery means during a portable operating cycle thereof.

20. A portable battery-powered system according to claim 16 further comprising charging control means operatively coupled with said battery means for controlling rate of charging of said battery means.

* * * * *

UNITED STATES PATENT AND TRADEMARK OFFICE
CERTIFICATE OF CORRECTION

PATENT NO.   : 5,278,487

Page 1 of 2

DATED        : January 11, 1994

INVENTOR(S)  : Steven E. Koenck

It is certified that error appears in the above-identified patent and that said Letters Patent is hereby corrected as shown below:

In the Drawings:

Add the drawing sheet, consisting of fig. 24 as shown on the attached page.

Signed and Sealed this

Fourth Day of June, 1996

Attest:

BRUCE LEHMAN

*Attesting Officer*          *Commissioner of Patents and Trademarks*